(12) United States Patent
Izawa et al.

(10) Patent No.: US 10,120,250 B2
(45) Date of Patent: Nov. 6, 2018

(54) ELECTRO-OPTICAL DEVICE, ELECTRICAL APPARATUS

(71) Applicant: SEIKO EPSON CORPORATION, Tokyo (JP)

(72) Inventors: Shotaro Izawa, Chitose (JP); Satoshi Ito, Eniwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/694,447

(22) Filed: Sep. 1, 2017

(65) Prior Publication Data

US 2018/0067368 A1 Mar. 8, 2018

(30) Foreign Application Priority Data

Sep. 8, 2016 (JP) .................. 2016-175292

(51) Int. Cl.
  G02F 1/1333 (2006.01)
  G02F 1/1343 (2006.01)
  G02F 1/1362 (2006.01)
  G02F 1/1368 (2006.01)
  H01L 27/12 (2006.01)
  H01L 29/786 (2006.01)

(52) U.S. Cl.
  CPC ...... *G02F 1/136213* (2013.01); *G02F 1/1368* (2013.01); *G02F 1/133345* (2013.01); *G02F 1/134309* (2013.01); *G02F 1/136286* (2013.01); *H01L 27/124* (2013.01); *H01L 27/1222* (2013.01); *H01L 27/1255* (2013.01); *H01L 29/78621* (2013.01); *H01L 29/78633* (2013.01); *H01L 29/78678* (2013.01); *G02F 2201/121* (2013.01); *G02F 2201/123* (2013.01)

(58) Field of Classification Search
  CPC ......... G02F 1/136213; G02F 1/133345; G02F 1/134309; G02F 1/136286; G02F 1/1368; G02F 2201/121; G02F 2201/123; H01L 27/1222; H01L 27/124; H01L 27/1255; H01L 29/78621; H01L 29/78633; H01L 29/78678
  See application file for complete search history.

(56) References Cited

U.S. PATENT DOCUMENTS

| 2009/0051840 A1* | 2/2009 | Yasukawa ......... G02F 1/136213 349/39 |
| 2010/0012979 A1* | 1/2010 | Ishii .................. G02F 1/136209 257/203 |
| 2010/0033645 A1* | 2/2010 | Nakagawa ........ G02F 1/136213 349/39 |
| 2016/0377910 A1 | 12/2016 | Ito |

FOREIGN PATENT DOCUMENTS

| JP | 2002-131768 A | 5/2002 |
| JP | 2009-157025 A | 7/2009 |
| JP | 3199691 U | 9/2015 |
| JP | 3199692 U | 9/2015 |

* cited by examiner

*Primary Examiner* — Nathanael R Briggs
(74) *Attorney, Agent, or Firm* — Oliff PLC

(57) ABSTRACT

A liquid crystal device serves as an electro-optical device and includes, on a base member of an element substrate, a first shield layer disposed between a gate electrode and a drain electrode of a TFT, and a second shield layer provided between the drain electrode and a data line serving as a signal line. A first holding capacitor is configured by part of the drain electrode, the first dielectric layer, and the second shield layer.

20 Claims, 16 Drawing Sheets

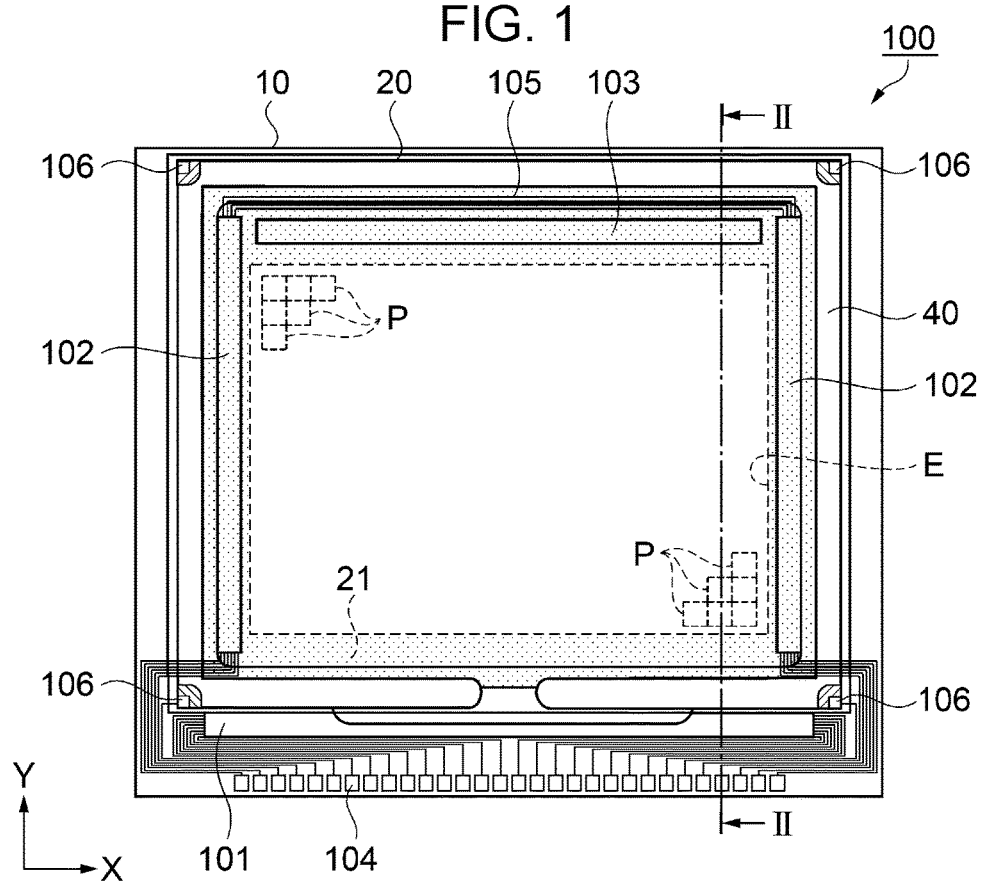
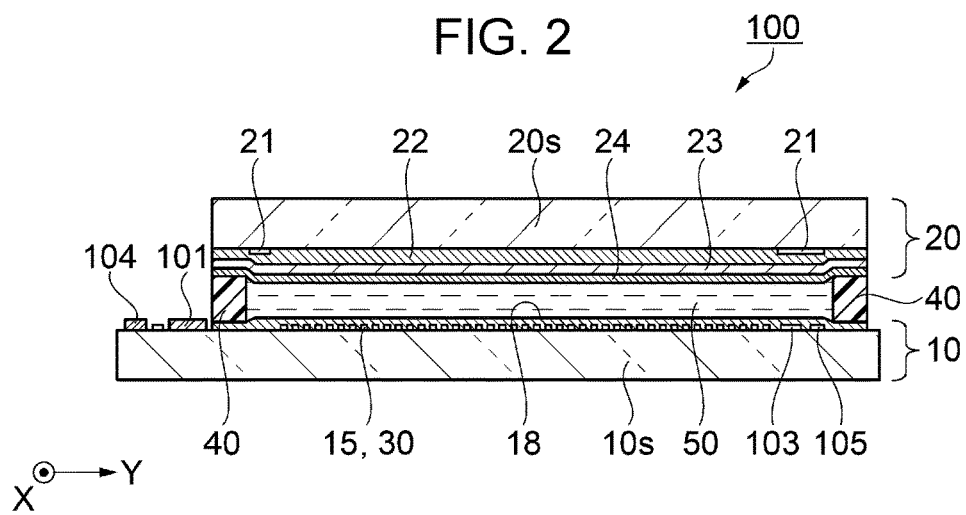

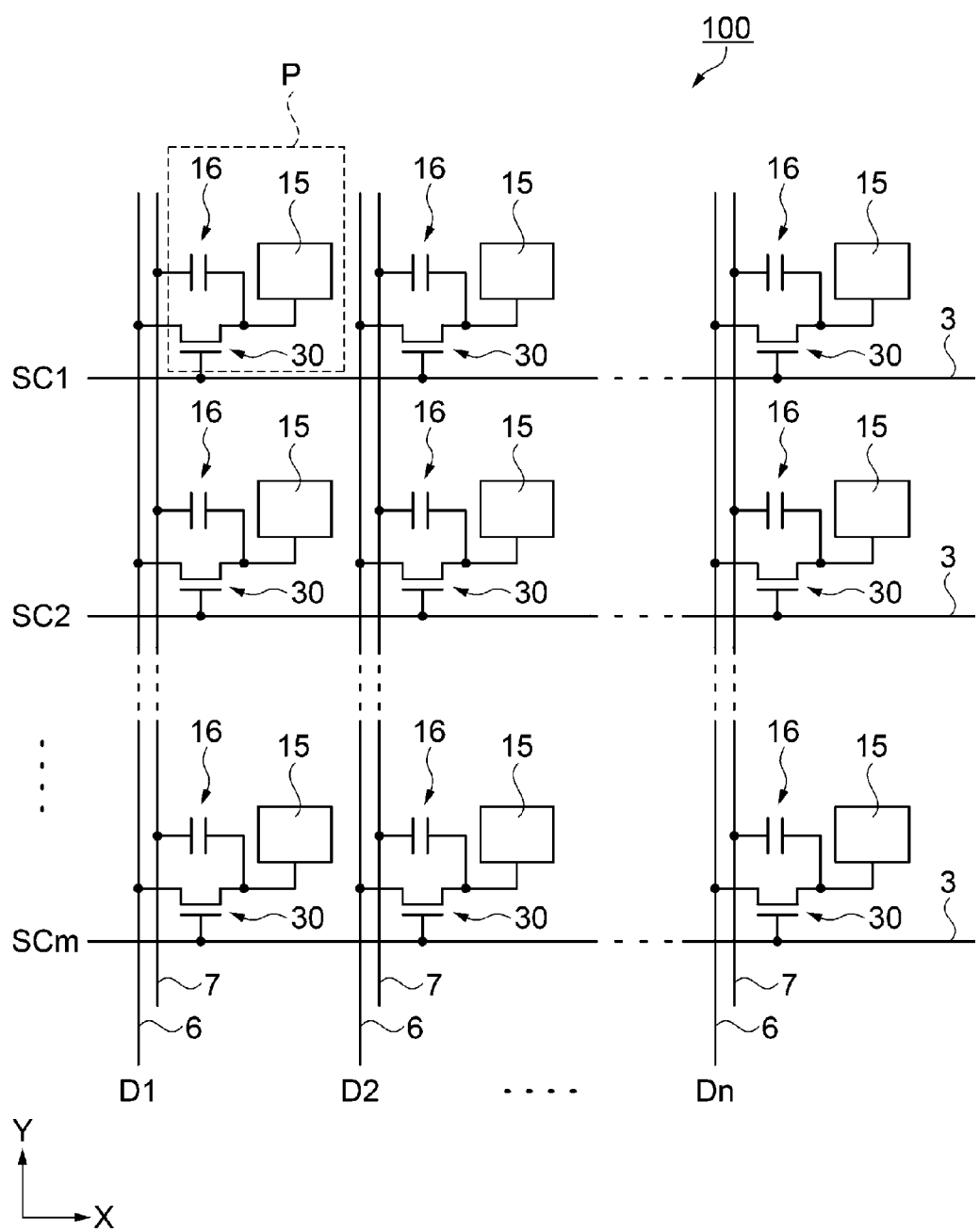

ELECTRO-OPTICAL DEVICE, ELECTRICAL APPARATUS

BACKGROUND

1. Technical Field

The present invention relates to an electro-optical device and an electrical apparatus.

2. Related Art

As electro-optical devices, actively driven types of electro-optical devices, such as liquid crystal devices, are known in which switching of pixels is controlled to perform display. In such actively driven types of liquid crystal device, a thin film transistor is, for example, formed on a substrate as a pixel electrode and a switching element for each pixel, and scan lines, signal lines, holding capacitors, and the like are formed on the substrate so as to be connected to the thin film transistors. There are accordingly plural wiring layers provided on the substrate to include these pixel configuration elements. However, there is a concern that electrical interactions affecting display might occur between the pixel configuration elements provided in the plural wiring layers, or between the pixel configuration elements and other electrical configuration elements, and there is a need for improvements in this respect.

For example, a liquid crystal display device is described in JP-A-2002-131768 in which scan lines connected to thin film transistors are covered by a conductive shield electrode, with a first insulator interposed therebetween. The liquid crystal display device includes a common electrode disposed on the opposite side of a liquid crystal layer to pixel electrodes. The same electrical potential is applied to the shield electrode as is applied to the common electrode. In the liquid crystal display device of JP-A-2002-131768, the scan lines are electrostatically shielded from the liquid crystal layer by the shield electrode, and this improves defects related to reliability, such as direct current potentials related to the electrical potentials of the scan lines being applied to the liquid crystal layer and shortening the life of the liquid crystal layer.

Moreover, JP-A-2002-131768 gives an example of configuring a holding capacitor portion by stacking a semiconductor layer for forming sources and drains of the thin film transistors, a gate insulation film, and a shield electrode on each other.

Furthermore, for example, JP-A-2009-157025 describes an electro-optical device including, on a substrate, a shield layer formed from a transparent conductive material above data lines but below pixel electrodes. The shield layer is formed continuously so as to span plural pixels. In the electro-optical device of JP-A-2009-157025, the shield layer is formed so as to be superimposed on the data lines and the pixel electrodes so as to try to prevent crosstalk caused by capacitive coupling between the data lines and the pixel electrodes. Moreover, JP-A-2009-157025 describes a storage capacitor provided between gate electrodes of the thin film transistors and the shield layer. A lower capacitor electrode of the storage capacitor is provided for each of the pixels, and a semiconductor layer and the pixel electrodes are connected to the thin film transistors.

However, while introducing the shield electrodes for the scan lines as in JP-A-2002-131768 or introducing the shield layer for the data lines as in JP-A-2009-157025 in order to try to suppress electrical interaction between pixel configuration elements provided in the plural wiring layers, or between the pixel configuration elements and other electrical configuration elements, in order to try to secure holding capacitor portions (storage capacitors) that affect display quality, there is the problem of the structure of the plural wiring layers on the substrate becoming more complicated.

Above all, in transmission-type liquid crystal devices, other than the pixel electrodes of the pixel configuration elements, any pixel configuration elements formed by employing conductive materials having light blocking properties need to be disposed in non-opening regions in consideration of the opening coverage ratio that affects display brightness. A problem accordingly arises of the need for ingenuity to avoid lowering the opening coverage ratio due to introducing the shield structure or the capacitor structure of JP-A-2002-131768 or JP-A-2009-157025.

SUMMARY

The invention has the advantage of enabling the following embodiments and application examples to be realized.

Application Example

An electro-optical device according to the present application example is an electro-optical device including an element substrate provided with a pixel electrode and a thin film transistor for each of plural pixels, a scan line, and a signal line. The electro-optical device is preferably configured including, on the element substrate, a drain electrode, a first shield layer, a first dielectric layer, a second shield layer, and a fixed potential line having the following characteristics. The drain electrode is disposed between a gate electrode of the thin film transistor and the signal line. The first shield layer is disposed between the gate electrode and the drain electrode and is configured to be applied with a fixed potential. The first dielectric layer is disposed between the drain electrode and the signal line and provided contacting part of the drain electrode. The second shield layer contacts the first dielectric layer. The fixed potential line is disposed between the second shield layer and the pixel electrode and is configured to be applied with the fixed potential. The second shield layer is connected to the fixed potential line. The drain electrode, the first dielectric layer, and the second shield layer configure a first holding capacitor.

The thin film transistor is switched ON and OFF by switching a potential applied to the gate electrode between a high level (High) and a low level (Low).

According to this application example, phenomena in which the potential of the drain electrode fluctuates due to the potential of the gate electrode switching (known as push down) can be prevented from arising due to the first shield layer applied with the fixed potential being disposed between the gate electrode and the drain electrode.

Moreover, crosstalk, arising due to fluctuations in the potential of the drain electrode caused by a potential related to the image signal applied to the signal line, can be prevented by the second shield layer applied with the same fixed potential being disposed between the drain electrode and the signal line.

Moreover, the first holding capacitor is configured by a portion of the drain electrode, the first dielectric layer, and the second shield layer.

Namely, holding capacitance can be secured while preventing fluctuations in the potential of the drain electrode by employing the two shield layers, enabling an electro-optical device capable of achieving excellent display quality to be provided. In addition, complications to the wiring structure in the element substrate can be avoided even though plural wiring layers including the two shield layers and the first holding capacitor are provided.

Application Example

An electro-optical device according to the present application example is an electro-optical device including an element substrate provided with a pixel electrode and a thin film transistor for each of plural pixels, a scan line, and a signal line. The electro-optical device is preferably configured including, on the element substrate, a drain electrode, a first shield layer, a first dielectric layer, a projection, a second shield layer, and a fixed potential line having the following characteristics. The drain electrode is disposed between a gate electrode of the thin film transistor and the signal line. The first shield layer is disposed between the gate electrode and the drain electrode and is configured to be applied with a fixed potential. The first dielectric layer is disposed between the drain electrode and the signal line and is provided contacting part of the drain electrode. The projection has insulating properties and is disposed between the drain electrode and the first dielectric layer. The second shield layer contacts the first dielectric layer. The fixed potential line is disposed between the second shield layer and the pixel electrode and is configured to be applied with the fixed potential. The second shield layer is connected to the fixed potential line at a portion of the fixed potential line superimposed on the projection in plan view of the element substrate. The drain electrode, the first dielectric layer, and the second shield layer configure a first holding capacitor.

According to this application example, phenomena in which the potential of the drain electrode fluctuates due to the potential of the gate electrode switching (known as push down) can be prevented from arising due to the first shield layer applied with the fixed potential being disposed between the gate electrode and the drain electrode.

Moreover, crosstalk arising due to fluctuations in the potential of the drain electrode caused by a potential related to the image signal applied to the signal line can be prevented due to the second shield layer applied with the same fixed potential being disposed between the drain electrode and the signal line.

Moreover, the first holding capacitor is configured by the portion of the drain electrode, the first dielectric layer, and the second shield layer. In addition, an electrical connection is made to the fixed potential line at a portion of the second shield layer superimposed on the projection having insulating properties disposed between the drain electrode and the first dielectric layer. Accordingly, the depth of the contact hole for the connection can be made shallower than in cases in which the fixed potential line and a portion of the second shield layer not superimposed on the projection are connected by, for example, a contact hole. Making the depth of the contact hole shallower enables the size of the contact hole to be made smaller in plan view of the element substrate, due to a relationship with the aspect ratio of the contact hole. Since the contact hole needs to be formed in a non-opening region that does not affect display, making the size of the contact hole smaller enables the contact hole to be easily provided even when non-opening regions are narrow. Accordingly, a desired opening coverage ratio in the pixels can be secured even when the two shield layers and the first holding capacitor are provided to the element substrate in this manner.

Namely, holding capacitance can be secured while preventing fluctuations in the potential of the drain electrode by employing the two shield layers, and an electro-optical device capable of achieving excellent display quality can be provided. In addition, complications to the wiring structure of the element substrate can be avoided even when plural wiring layers including the two shield layers and the first holding capacitor are included, enabling an electro-optical device capable of bright display to be provided.

In the electro-optical device of the application example above, configuration is preferably made such that the scan line extends along a first direction, and part of the scan line acts as the gate electrode, and the first shield layer extends in the first direction superimposed on the scan line in plan view of the element substrate.

According to this configuration, push down of the potential of the drain electrode can be reliably prevented since the first shield layer is superimposed on the scan line extending in the first direction and functioning as the gate electrode.

The electro-optical device of the application example above is preferably configured such that the signal line extends in a second direction intersecting the first direction, and the fixed potential line extends in the second direction superimposed on the signal line in plan view of the element substrate.

According to this configuration, the fixed potential line is present between the signal line and the pixel electrode, thus enabling prevention of fluctuations in the potential of the pixel electrode due to the potential of the signal line.

The electro-optical device of the application example above is preferably configured such that the electro-optical device further includes a trench and a second holding capacitor having the following characteristics. The trench is provided in an intermediate insulation film between the fixed potential line and the pixel electrode. The second holding capacitor is configured by a first capacitor electrode covering at least the trench, a second dielectric layer contacting the first capacitor electrode, and a second capacitor electrode contacting the second dielectric layer. The first capacitor electrode and the fixed potential line are connected together at a portion at the bottom of the trench. The pixel electrode is connected to the drain electrode through the second capacitor electrode.

According to this configuration, fluctuations in the potential of the pixel electrode can be suppressed due to providing the second holding capacitor in addition to the first holding capacitor. Moreover, due to the second holding capacitor including the trench provided to the intermediate insulation film between the fixed potential line and the pixel electrode, the desired electrical capacitance is more easily secured compared to cases in which the first capacitor electrode is has a flat plate shape, even when non-opening regions are narrower.

The electro-optical device of the application example above preferably further includes an opposing substrate including a common electrode that is disposed facing across a liquid crystal layer toward the plural pixel electrodes of the element substrate. Moreover, a potential applied to the common electrode and the fixed potential are preferably the same potential as each other.

According to this configuration, the configuration in the electrical circuit can be simplified since the fixed potential applied to the first shield layer and the second shield layer and the potential of the common electrode can be made the same as each other.

Application Example

An electrical apparatus according to the present application example preferably includes the electro-optical device of the application examples above.

According to this application example, an electrical apparatus with a pleasing appearance can be provided due to including an electro-optical device capable of implementing excellent display quality.

BRIEF DESCRIPTION OF THE DRAWINGS

The invention will be described with reference to the accompanying drawings, wherein like numbers reference like elements.

FIG. 1 is a schematic plan view illustrating a configuration of a liquid crystal device serving as an electro-optical device of a first embodiment.

FIG. 2 is a schematic cross-section taken along line II-II of the liquid crystal device illustrated in FIG. 1.

FIG. 3 is an equivalent circuit diagram illustrating an electrical configuration of a liquid crystal device.

DESCRIPTION OF EXEMPLARY EMBODIMENTS

Figure 4:
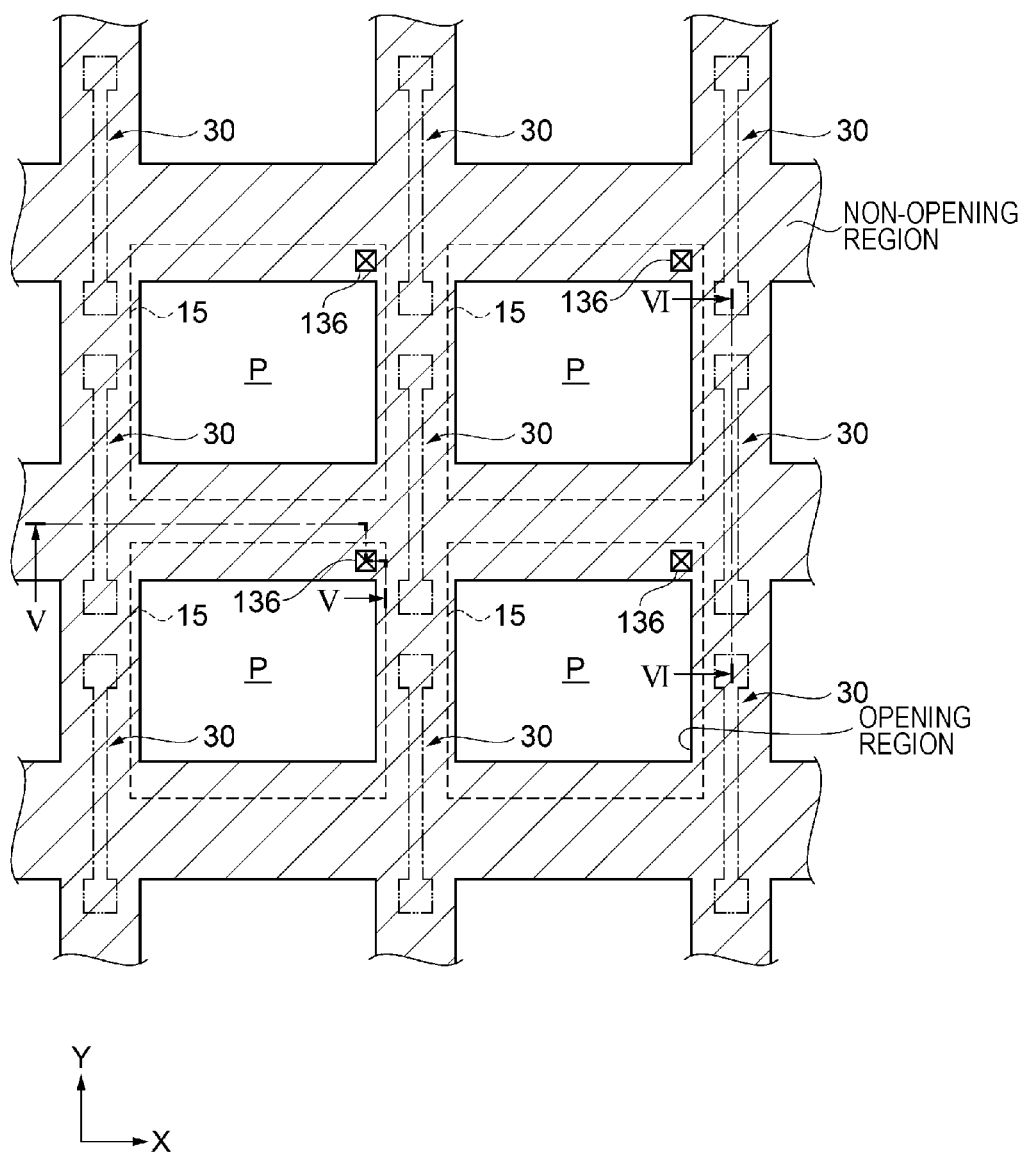
FIG. 4 is a schematic plan view illustrating a pixel layout.

Explanation follows regarding specific embodiments of the invention, with reference to the drawings. Note that the drawings employed are enlarged or reduced as appropriate so as to render portions being explained in a visible state.

In the present embodiments, explanation is given of an example of an actively driven type of liquid crystal device, serving as an electro-optical device and including a thin film transistor (referred to below as a TFT) for each pixel. This liquid crystal device may, for example, be appropriately employed as a light modulation element (liquid crystal light bulb) in a projection-type display device (liquid crystal projector), described later.

First Embodiment

Electro-Optical Device

Explanation first follows regarding a configuration of a liquid crystal device serving as an electro-optical device of the present embodiment, with reference to FIG. 1 to FIG. 3. FIG. 1 is a schematic plan view illustrating a configuration of a liquid crystal device. FIG. 2 is a schematic cross-section taken along line II-II of the liquid crystal device illustrated in FIG. 1. FIG. 3 is an equivalent circuit diagram illustrating an electrical configuration of a liquid crystal device.

As illustrated in FIG. 1 and FIG. 2, a liquid crystal device 100 of the present embodiment includes an element substrate 10 and an opposing substrate 20 disposed so as to face each other, with a liquid crystal layer 50 interposed and held between this pair of substrates. A base member 10s of the element substrate 10 and a base member 20s of the opposing substrate 20 are each transparent, and, for example, a quartz substrate or a glass substrate may be employed therefor. Note that reference in the present specification to being transparent means a property of being able to transmit to at least 85% or more of light of wavelengths in the visible light region.

The element substrate 10 is larger all around than the opposing substrate 20. The element substrate 10 and the opposing substrate 20 are stuck together with a seal member 40 interposed therebetween and running as a frame along an outer edge of the opposing substrate 20. A liquid crystal layer 50 is configured by filling the thus formed gap with a liquid crystal having positive or negative dielectric anisotropy. For example, an adhesive such as a thermosetting or UV-curing epoxy resin may be employed as the seal member 40. Spacers (not illustrated in the drawings) are incorporated into the seal member 40 to hold the pair of substrates a fixed distance apart.

A display region E1 is provided at the inside of the seal member 40, and plural pixels P are arrayed in a matrix pattern in the display region E1. An edging portion 21 is provided to the opposing substrate 20 between the seal member 40 and the display region E1, so as to surround the display region E1. The edging portion 21 is configured, for example, from a metal, a metal oxide, or the like having light blocking properties. Note that in addition to plural pixels P that contribute to display, the display region E1 may also contain dummy pixels arranged so as to surround the plural pixels P.

A terminal section arrayed with plural external connection terminals 104 is provided to the element substrate 10. A data line driving circuit 101 is provided between a first edge running along the terminal section of the element substrate 10 and the seal member 40. An inspection circuit 103 is provided between the seal member 40 running along a second edge facing the first edge and the display region E1. Moreover, scan line driving circuits 102 are provided between the display region E1 and the seal member 40 where the shield member 40 runs along a third edge and a fourth edge, which face each other and are orthogonal to the first edge. Plural wiring lines 105 are provided between the seal member 40 on the second edge and the inspection circuit 103, and the plural wiring lines 105 connect the two scan line driving circuits 102 together.

The wiring lines that connect the data line driving circuit 101 and the scan line driving circuits 102 together are connected to the plural external connection terminals 104 arrayed along the first edge. In the following explanation, the direction along the first edge is referred to as the X direction, and the direction along the third side and the fourth side is referred to as the Y direction. In the present specification reference is made to "plan view" or "in plan view" when the element substrate 10 and the opposing substrate 20 are viewed in a direction orthogonal to the X direction and the Y direction. Note that the X direction corresponds to the first direction of the invention, and the Y direction corresponds to the second direction of the invention.

As illustrated in FIG. 2, the element substrate 10 includes the base member 10s, TFTs 30 and pixel electrodes 15 formed on the liquid crystal layer 50 side of the base member 10s, an oriented film 18 covering the pixel electrodes 15, and the like. The TFTs 30 and the pixel electrodes 15 are configuration elements of the pixels P. Details regarding the pixels P are described later.

The opposing substrate 20 includes the base member 20s, and the edging portion 21, a planarization layer 22, a common electrode 23, an oriented film 24, and the like stacked in this sequence on surface of the base member 20s on the liquid crystal layer 50 side.

The edging portion 21 surrounds the display region E1 as illustrated in FIG. 1, and is provided at positions superimposed on the scan line driving circuits 102 and the inspection circuit 103 in plan view. This blocks light from the opposing substrate 20 side from being incident onto peripheral circuits including the driving circuits, and has the role of preventing inadvertent operation of the peripheral circuits by light. Unwanted stray light is blocked so as not to be incident onto the display region E1, thereby securing a high contrast for display in the display region E1.

The planarization layer 22 is, for example, formed from an inorganic material such as an oxide of silicon, is transparent, and is provided so as to cover the edging portion 21. Such a planarization layer 22 is, for example, a silicon oxide film formed using a plasma CVD method or the like. The planarization layer 22 has a layer thickness enabling surface indentations and protrusions on the common electrode 23 formed over the planarization layer 22 to be alleviated.

The common electrode 23 is, for example, configured by a transparent conductive film such as indium tin oxide (ITO) or indium zinc oxide (IZO), covers the planarization layer 22, and is electrically connected to wiring lines on the element substrate 10 side by vertical conductors 106 provided at the four corners of the opposing substrate 20, as illustrated in FIG. 1.

The oriented film 18 covering the pixel electrodes 15 and the oriented film 24 covering the common electrode 23 are set according to the optical design of the liquid crystal device 100, and oblique vapor deposition films (inorganic oriented films) of an inorganic material such as an oxide of silicon may be employed therefor. Other than the inorganic oriented films, organic oriented films of polyimide or the like may also be employed for the oriented films 18, 24.

The liquid crystal device 100 configured in this manner is a transmission type of liquid crystal device, and employs an optical design having a normally white mode in which the pixels P display bright when not being driven, or an optical design having a normally black mode in which the pixels P display dark when not being driven. Polarizers, respectively disposed on the light incident side and the light emitting side, are employed depending on the optical design.

Next, description follows regarding electrical configuration of the liquid crystal device 100, with reference to FIG. 3. The liquid crystal device 100 includes plural scan lines 3 and plural data lines 6 that are insulated from each other and orthogonal to each other at least in the display region E1, and fixed potential lines 7. The data lines 6 correspond to the signal lines of the invention.

The pixel electrodes 15, the TFTs 30, and holding capacitors 16 are provided in regions partitioned by the scan lines 3 and the data lines 6, and these configure the pixel circuits for the pixels P.

The scan lines 3 are electrically connected to the gates of the TFTs 30, the data lines 6 are electrically connected to first source/drain regions of the TFTs 30, and the pixel electrodes 15 are electrically connected to second source/drain regions of the TFTs 30.

The data lines 6 are connected to the data line driving circuit 101 (see FIG. 1). Image signals D1, D2, . . . , Dn are supplied from the data line driving circuit 101 to each of the pixels P through the data lines 6. The scan lines 3 are connected to the scan line driving circuits 102 (see FIG. 1). Scan signals SC1, SC2, . . . , SCm are supplied from the scan line driving circuits 102 to the respective pixels P through the scan lines 3.

The image signals D1 to Dn supplied from the data line driving circuit 101 may be supplied in this sequence to the data lines 6 line-by-line, or may be supplied in groups to plural mutually adjacent data lines 6. The scan line driving circuits 102 supply the scan signals SC1 to SCm to the scan lines 3 line-by-line in pulses at predetermined timings.

The liquid crystal device 100 is configured such that the TFTs 30, which are switching elements, adopt an ON state for a fixed period of time according to input of the scan signals SC1 to SCm, and the image signals D1 to Dn supplied from the data lines 6 are written to the pixel electrodes 15 at a predetermined timing. The image signals D1 to Dn having predetermined levels written to the liquid crystal layer 50 via the pixel electrodes 15 are then held for a fixed duration between the pixel electrodes 15 and the common electrode 23.

In order to prevent leakage of the image signals D1 to Dn which are being held, the holding capacitors 16 are connected in parallel to the liquid crystal capacitors formed between the pixel electrodes 15 and the common electrode 23. A more detailed description is given later, but briefly in the present embodiment the holding capacitors 16 are configured including first holding capacitors 16A and second holding capacitors 16B (see FIG. 5).

Note that the data lines 6 are connected to the inspection circuit 103 illustrated in FIG. 1, in a configuration enabling operational defects and the like in the liquid crystal device 100 to be checked for during the liquid crystal device 100 fabrication processes by detecting the image signals referred to above. However, this detail is omitted in the equivalent circuit of FIG. 3.

Moreover, the peripheral circuits for driving the pixel circuits of the pixels P, including the data line driving circuit 101 and the scan line driving circuits 102, may include sampling circuits to sample the image signals and supply the sampled image signals to the data lines 6, and pre-charge circuits to supply a pre-charge signal having a predetermined voltage level to the data lines 6 prior to the image signal.

Next, explanation follows regarding a configuration of the pixels P in the liquid crystal device 100, with reference to FIG. 4. FIG. 4 is a schematic plan view illustrating a pixel layout.

As illustrated in FIG. 4, the pixels P in the liquid crystal device 100 include opening regions that are, for example, substantially rectangular shaped in plan view. The opening regions are surrounded by light blocking non-opening regions provided in a lattice pattern extending in the X direction and the Y direction.

The scan lines 3 illustrated in FIG. 3 are provided in the non-opening regions that extend in the X direction. A light blocking conductive member is employed for the scan lines 3, and part of the non-opening regions is configured by the scan lines 3.

In the same way, the data lines 6 and the fixed potential lines 7 illustrated in FIG. 3 are provided in the non-opening regions that extend in the Y direction. A light blocking conductive member is also employed for the data lines 6 and the fixed potential lines 7, and part of the non-opening regions is configured by the data lines 6 and the fixed potential lines 7.

The TFTs 30 are provided so as to straddle intersecting portions of the non-opening regions and so as to be superimposed on the non-opening regions that extend in the Y direction. A more detailed description of the structure of the element substrate 10 is given later, but briefly, due to the relationship of the TFTs 30 being provided in the vicinity of the intersecting portions, the width in the Y direction of the non-opening regions that extend in the X direction is wider than the width in the X direction of the non-opening regions that extend in the Y direction. The opening coverage ratio for the opening regions is secured due to providing the TFTs 30 in the vicinity of the intersecting portions of the light blocking non-opening regions.

Each of the pixels P is provided with one of the pixel electrodes 15. The pixel electrodes 15 have a substantially rectangular shape in plan view, and are provided in the opening regions such that the outer edges of the pixel electrodes 15 overlap with the non-opening regions.

The liquid crystal device 100 of the present embodiment is a transmission type of liquid crystal device that assumes that light is incident from the opposing substrate 20 side, and that has a light blocking structure incorporated into the element substrate 10 to block light from being incident to the TFTs 30, so as to enable the generation of light-induced leakage current to be suppressed. The structure of the element substrate 10 is also designed such that display defects are not generated in the pixels P by electrical interactions involving configuration elements of the pixels P, such as the TFTs 30. Next, explanation follows regarding a structure of the element substrate 10 according to the invention.

Element Substrate Structure

Figure 5:
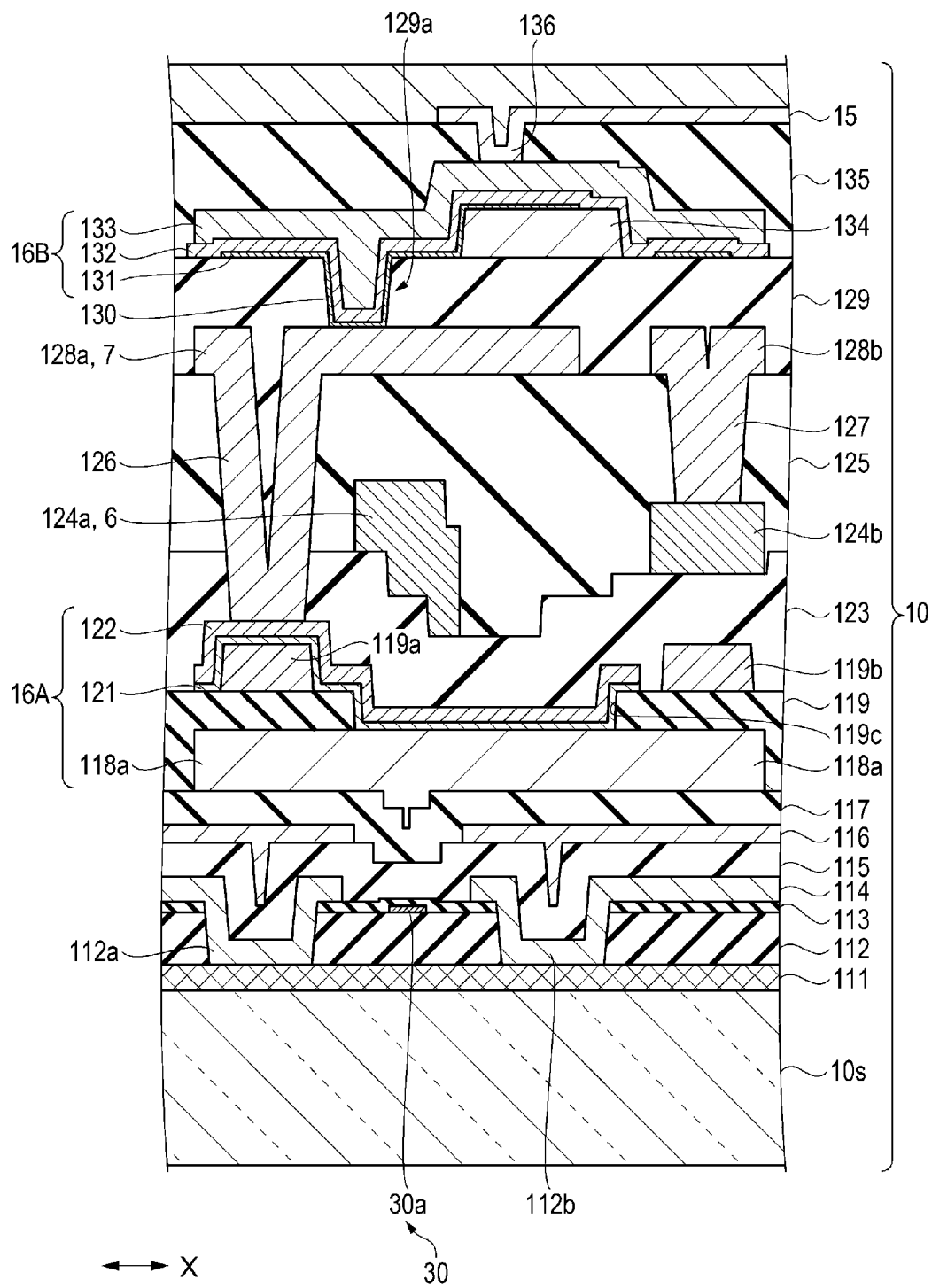
FIG. 5 is a schematic cross-section taken along line V-V of FIG. 4 and illustrating a configuration of an element substrate.
Figure 6:
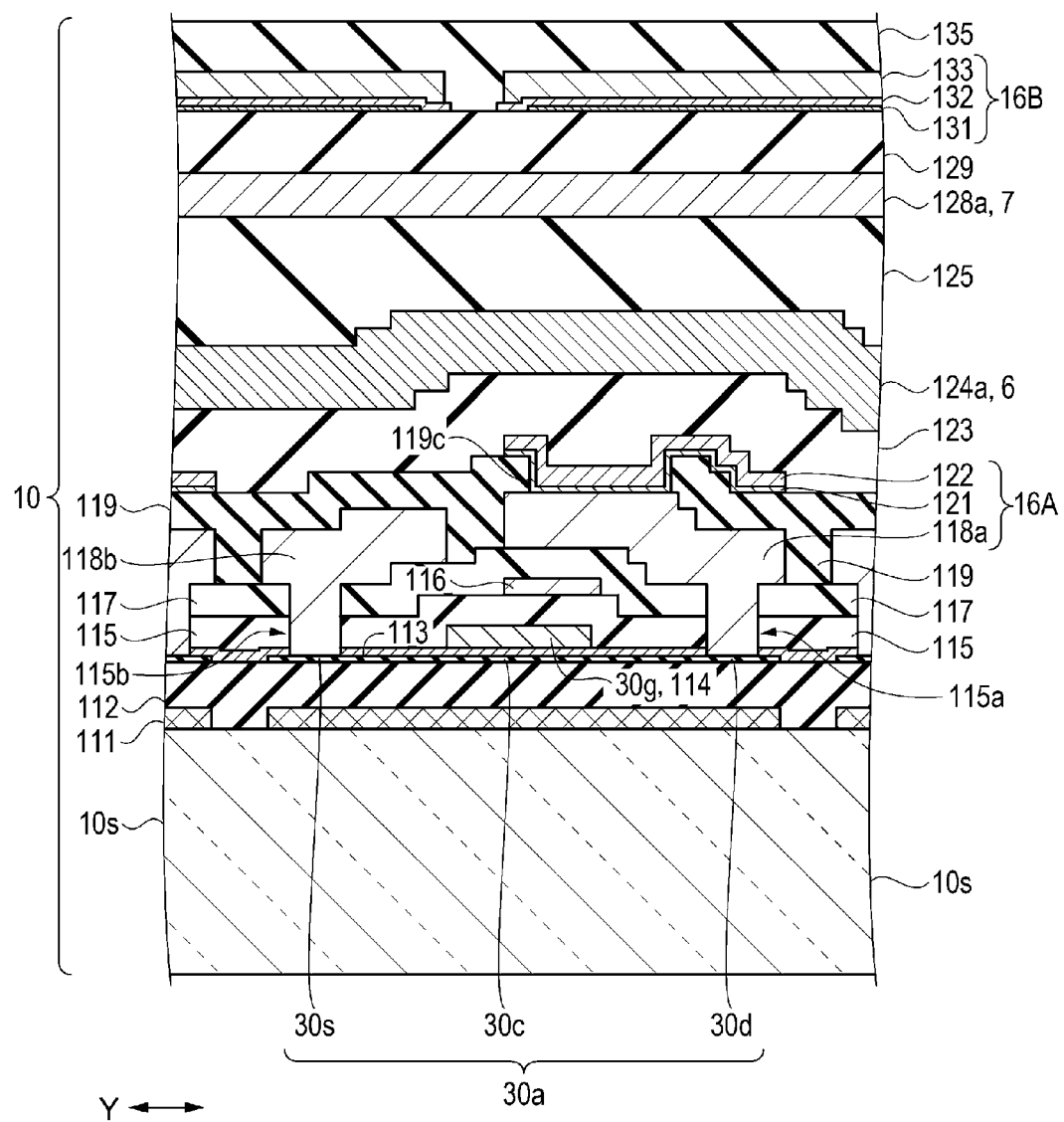
FIG. 6 is a schematic cross-section taken along line VI-VI of FIG. 4 and illustrating a configuration of an element substrate.

FIG. 5 is a schematic cross-section taken along line V-V in FIG. 4 and illustrating a structure of an element substrate. FIG. 6 is a schematic cross-section taken along line VI-VI in FIG. 4 and illustrating a structure of the element substrate. More specifically, the line V-V in FIG. 4 is a line segment that cuts across the intersecting portions of the non-opening regions in the X direction and then cuts across a contact hole 136 of the pixel electrode 15. The line VI-VI in FIG. 4 is a line segment along the Y direction that cuts across one of the TFTs 30 disposed in the non-opening regions. Note that FIG. 5 and FIG. 6 are schematic cross-sections to facilitate explanation of the structure of the element substrate 10, and are not cross-sections taken precisely along line V-V or line VI-VI.

As illustrated in FIG. 5 and FIG. 6, light blocking portions 111 are initially formed on the base member 10s of the element substrate 10 by employing, for example: a single metal, an alloy, a metal silicide, a polysilicide including at least one metal having a high melting point, such as Ti, Cr, Mo, Ta, or W; a layered body formed from these; a conductive polysilicon; or the like. The light blocking portions 111 are preferably formed by employing a metal silicide from the perspectives of blocking returning light that was initially incident from the base member 10s side, and not reflecting light that was incident from the opposing substrate 20 side. The light blocking portions 111 in the present embodiment are formed by employing tungsten silicide (WSi). The film thickness of the light blocking portions 111 is, for example, approximately 200 nm.

A first layer intermediate insulation film 112 is then formed covering the light blocking portions 111. The first layer intermediate insulation film 112 is formed by employing, for example, silicon oxide. The film thickness of the first layer intermediate insulation film 112 is, for example, approximately 450 nm.

Next, a semiconductor layer 30a of each of the TFTs 30 is formed on the first layer intermediate insulation film 112. The semiconductor layer 30a is, for example, formed by employing polysilicon selectively implanted with impurity ions, and, as illustrated in FIG. 6, is constructed with a lightly doped drain (LDD) structure including a first source/drain region 30d, a channel region 30c, and a second source/drain region 30s. The film thickness of the semiconductor layer 30a is, for example, approximately 40 nm.

A gate insulation film 113 is then formed covering the semiconductor layer 30a. The gate insulation film 113 is formed by employing, for example, silicon oxide. The film thickness of the gate insulation film 113 is, for example, approximately 90 nm.

As illustrated in FIG. 5, through holes are formed in groove shapes piercing through the first layer intermediate insulation film 112 and the gate insulation film 113 so as to reach the light blocking portions 111. A wiring line 114 and a pair of contact holes 112a, 112b are then formed by forming a conductive film so as to fill these through holes, and then patterning the conductive film. The light blocking portions 111 and the wiring lines 114 are thereby electrically connected together so as to function as the scan lines 3. Light is blocked from being incident through the sides of the semiconductor layer 30a of the TFTs 30 by the pair of contact holes 112a, 112b formed on either side of the semiconductor layer 30a.

As illustrated in FIG. 6, part of the wiring line 114 is formed so as to face across the gate insulation film 113 toward the channel region 30c of the semiconductor layer 30a, and functions as a gate electrode 30g.

An example of the wiring line 114, namely, an example of a conductive film employed for the gate electrode 30g, is a conductive film formed by layering a metal silicide film on a conductive polysilicon film. The film thickness of the wiring line 114 is, for example, approximately 200 nm.

Then a second layer intermediate insulation film 115 is formed so as to cover the gate electrode 30g and the gate insulation film 113 of the TFT 30. The second layer intermediate insulation film 115 is, for example, formed by employing silicon oxide, and the film thickness thereof is, for example, approximately 300 nm.

A first shield layer 116 is formed by forming a conductive film on the second layer intermediate insulation film 115 and then patterning the conductive film. As illustrated in FIG. 6, the first shield layer 116 is formed so as to be superimposed on the gate electrode 30g, with the second layer intermediate insulation film 115 interposed therebetween. The first shield layer 116 employs, for example, a metal nitride film, such as TiNa and, for example, has a film thickness of approximately 150 nm.

A third layer intermediate insulation film 117 is then formed covering the first shield layer 116 and the second layer intermediate insulation film 115. The third layer intermediate insulation film 117 is formed by employing, for example, silicon oxide, and, for example, has a film thickness of approximately 400 nm.

As illustrated in FIG. 6, through holes are formed in the gate insulation film 113 and the second layer intermediate insulation film 115, and in the third layer intermediate insulation film 117, so as to pierce through to the semiconductor layer 30a at positions superimposed on the first source/drain region 30d and the second source/drain region 30s of the semiconductor layer 30a. A drain electrode 118a and a contact hole 115a are integrally formed, and a source electrode 118b and a contact hole 115b are integrally formed, by forming a conductive film on the third layer intermediate insulation film 117 so as to fill the inside of the through holes and then patterning the conductive film.

The conductive film employed for the drain electrode 118a and the source electrode 118b is a low resistance wiring material, and examples thereof include metals such as aluminum (Al) or titanium (Ti) and metal compounds thereof. In the present embodiment, the conductive film is configured by forming a four layer structure of, from the base member 10s side, a titanium (Ti) layer/a titanium nitride (TiN) layer/an aluminum (Al) layer/a titanium nitride (TiN) layer. The film thickness of the Ti layer is, for example, approximately 20 nm, the film thickness of the earlier formed TiN layer is, for example, 50 nm, the film thickness of the Al layer is, for example, 300 nm, and the film thickness of the later formed TiN layer is, for example, 150 nm.

As illustrated in FIG. 5 and FIG. 6, the first shield layer 116 is disposed on the base member 10s between the gate electrode 30g (the wiring line 114) and the drain electrode 118a. A wiring line, including the drain electrode 118a and the source electrode 118b formed in the same layer, is referred to in the description as a wiring line 118.

A fourth layer intermediate insulation film 119 is then formed covering the wiring line 118 and the third layer intermediate insulation film 117. The fourth layer intermediate insulation film 119 is formed by employing, for example, silicon oxide, and has film thickness of, for example, approximately 200 nm. Moreover, as illustrated in FIG. 5, two projections 119a, 119b are formed on the fourth layer intermediate insulation film 119 at a height of approximately 400 nm above the fourth layer intermediate insulation film 119. The two projections 119a, 119b are also formed by employing, for example, silicon oxide. Moreover, as illustrated in FIG. 5 and FIG. 6, part of the fourth layer intermediate insulation film 119 superimposed on the drain electrode 118a is removed so as to form an opening 119c in the fourth layer intermediate insulation film 119.

A specific method of forming the fourth layer intermediate insulation film 119 provided in this manner with the projections 119a, 119b, and the opening 119c is to first form a silicon oxide film having a film thickness of approximately 600 nm so as to cover the wiring lines 118. A portion thereof corresponding to the two projections 119a, 119b is then removed, and this silicon oxide film is etched thinner to 200 nm. The two projections 119a, 119b accordingly protrude upward. The opening 119c is then formed in the silicon oxide film by covering portions other than the portions corresponding to the opening 119c with a resist, and etching the silicon oxide film.

Next, a layered film is formed covering the fourth layer intermediate insulation film 119 formed with the projections 119a, 119b, and the opening 119c by forming a dielectric film and a conductive film in this sequence. The layered film is then patterned all at once such that portions of the layered film superimposed on the projections 119a and the opening 119c remain, but other portions of the layered film are removed. Examples of such a dielectric film include a multi-layered film of an aluminum oxide ($Al_2O_3$) film and a hafnium oxide ($HfO_2$) film repeatedly layered in this sequence, and the film thickness thereof is, for example, 34 nm. The above conductive film is, for example, a titanium nitride (TiN) film with a film thickness of, for example, 200 nm. Thereby, as illustrated in FIG. 5, a first dielectric layer 121 configured by the above dielectric film and a second shield layer 122 configured by above conductive film are formed in a region that includes the projection 119a and the opening 119c. The first holding capacitor 16A is configured by the drain electrode 118a and the second shield layer 122 disposed facing each other across the first dielectric layer 121 at the opening 119c in the fourth layer intermediate insulation film 119.

Then, a fifth layer intermediate insulation film 123 is formed covering the second shield layer 122 and the fourth layer intermediate insulation film 119 including the projection 119b. The fifth layer intermediate insulation film 123 is, for example, a silicon oxide film having a film thickness of, for example, 600 nm.

Then, a conductive film is formed covering the fifth layer intermediate insulation film 123, and the conductive film is patterned to form a wiring line 124a and a relay layer 124b, as illustrated in FIG. 5 and FIG. 6. Details are given later, but briefly, the wiring line 124a functions as a data line 6, and the relay layer 124b functions to electrically connect the drain electrode 118a and the pixel electrode 15 together. An example of the conductive film configuring the wiring line 124a and the relay layer 124b is, for example, a three layer structure of, from the base member 10s side, a TiN layer/an Al layer/and a TiN layer. The film thickness of the earlier formed TiN layer is, for example, 50 nm, the film thickness of the Al layer is, for example, 350 nm, and the film thickness of the later formed TiN layer is, for example, 200 nm.

Then, a sixth layer intermediate insulation film 125 is formed covering the wiring line 124a and the relay layer 124b, and covering the fifth layer intermediate insulation film 123. The sixth layer intermediate insulation film 125 is, for example, a silicon oxide film, and indentations and protrusions arise on the surface thereof due to covering lower wiring layers including the TFTs 30 formed up to this point. Thus, from the perspective of securing the planarity of wiring layers to be subsequently formed, planarization processing is performed to diminish or remove the indentations and protrusions on the surface of the sixth layer intermediate insulation film 125. Examples of planarization processing include chemical mechanical polishing (CMP), and processing that combines both CMP processing and etching. The film thickness of the sixth layer intermediate insulation film 125 is, for example, 900 nm at the thinnest portion thereof.

Then, through holes are formed piercing through the fifth layer intermediate insulation film 123 and the sixth layer intermediate insulation film 125 so as to reach the portion of the second shield layer 122 superimposed on the two projections 119a of the fourth layer intermediate insulation film 119. Through holes are also formed piercing through the sixth layer intermediate insulation film 125 so as to reach the relay layer 124b. A conductive film is then formed covering the sixth layer intermediate insulation film 125 so as to cover the inside of these through holes. Patterning is then performed thereon so as to form a contact hole 126 and a wiring line 128a for connecting to the second shield layer 122, and so as to form a contact hole 127 and a relay layer 128b for connecting to the relay layer 124b. The wiring line 128a connected to the second shield layer 122 via the contact hole 126 functions as the fixed potential line 7 in the equivalent circuit illustrated in FIG. 3. The conductive film configuring the wiring line 128a and the relay layer 128b is, for example, a two layer structure, from the base member 10s side, of an Al layer/a TiN layer. The film thickness of the Al layer is, for example, 200 nm, and the film thickness of the TiN layer is, for example, 200 nm.

Next a seventh layer intermediate insulation film 129 is formed covering the wiring line 128a, the relay layer 128b, and the sixth layer intermediate insulation film 125. Moreover, as illustrated in FIG. 5, a trench (groove) 129a that reaches the wiring line 128a, and a projection 134 that projects toward the pixel electrode 15 side and has a trapezoidal profile in cross-section, are formed in the seventh layer intermediate insulation film 129. The method of forming the trench 129a and the projection 134 is similar to the method described above for forming the projections 119a, 119b and the opening 119c in the fourth layer intermediate insulation film 119. Namely, the trench 129a and the projection 134 are formed by selectively etching a silicon oxide film formed at a predetermined film thickness (for example, 1000 nm). The depth of the trench 129a in the present embodiment is, for example, approximately 600 nm, and the height of the projection 134 above the seventh layer intermediate insulation film 129 is, for example, 400 nm. Details are given later, but briefly, the projection 134 is formed such that part of the projection 134 is superimposed on the contact hole 136 of the pixel electrode 15. Moreover, the seventh layer intermediate insulation film 129 is an example of an intermediate insulation film between a fixed potential line and a pixel electrode of the invention.

A first capacitor electrode 131 is then formed covering at least the trench 129a and the part of the projection 134 described above. The first capacitor electrode 131 is, for example, configured by a metal nitride film, such as TiN, with a film thickness of, for example, 50 nm. A second dielectric layer 132 is then formed contacting and covering the first capacitor electrode 131. The second dielectric layer 132 is, for example, a multi-layered film of an aluminum oxide ($Al_2O_3$) film and a hafnium oxide ($HfO_2$) film repeatedly layered in this sequence, and the film thickness thereof is, for example, 34 nm. Moreover, a second capacitor electrode 133 is formed contacting and covering the second dielectric layer 132. The second capacitor electrode 133 is, for example, a metal nitride film such as TiN, and the film thickness thereof is, for example, 300 nm. A second holding capacitor 16B is thereby configured including the second dielectric layer 132 interposed between the first capacitor electrode 131 and the second capacitor electrode 133. Namely, the holding capacitors 16 illustrated in FIG. 3 are configured including the first holding capacitor 16A and the second holding capacitor 16B.

Then an eighth layer intermediate insulation film 135 is formed covering the second holding capacitor 16B and the seventh layer intermediate insulation film 129. The eighth layer intermediate insulation film 135 is, for example, a silicon oxide film. As illustrated in FIG. 5, the eighth layer intermediate insulation film 135 is formed so as to cover the second holding capacitor 16B above the projection 134, and indentations and protrusions therefore arise on the surface of the eighth layer intermediate insulation film 135. After this is performed, for example, planarization processing such as the CMP processing mentioned above is performed on the eighth layer intermediate insulation film 135 so as to achieve a planarized state of the pixel electrode 15 formed above the eighth layer intermediate insulation film 135. The film thickness of the thickest part of the eighth layer intermediate insulation film 135 after planarization processing is, for example, 400 nm.

Then, as illustrated in FIG. 5, a through hole is formed in the eighth layer intermediate insulation film 135 so as to reach the second capacitor electrode 133 above the projection 134. A transparent conductive film is then formed by employing, for example, indium tin oxide (ITO) or indium zinc oxide (IZO) so as to cover the inside of the through hole. The transparent conductive film is then patterned to form the pixel electrode 15 and the contact hole 136. The pixel electrode 15 is thereby connected to the second capacitor electrode 133 via the contact hole 136. The film thickness of the transparent conductive film forming the pixel electrode 15 is set in consideration of light transmissivity so as to achieve a transmittance of at least 85% in the visible light wavelength range, and is, for example, 140 nm.

In the structure of the element substrate 10 described above, the wiring lines and relay layers formed from Al, Ti, TiN, or the like are, for example, obtained by forming a conductive film by using a sputtering method employing a low resistance wiring material, and then patterning the conductive film. The low resistance wiring material Al is reflective to light, and so Al is preferably covered by TiN that has a lower reflectivity to light than Al and exhibits excellent adhesion to Al. Such a configuration enables light incident to the wiring lines and the relay layers to be suppressed from being reflected and becoming stray light.

Moreover, the silicon oxide film configuring the first to the eighth layer intermediate insulation films is formed, for example, by a plasma CVD method. The first to the eighth layer intermediate insulation films are not limited to being single layers, and may be configured by layering different types of insulation film. For example, the projections 119a, 119b may be made from an insulation material different to the fourth layer intermediate insulation film 119. Similarly the projection 134 may be made from an insulation material different to the seventh layer intermediate insulation film 129.

Figure 7:
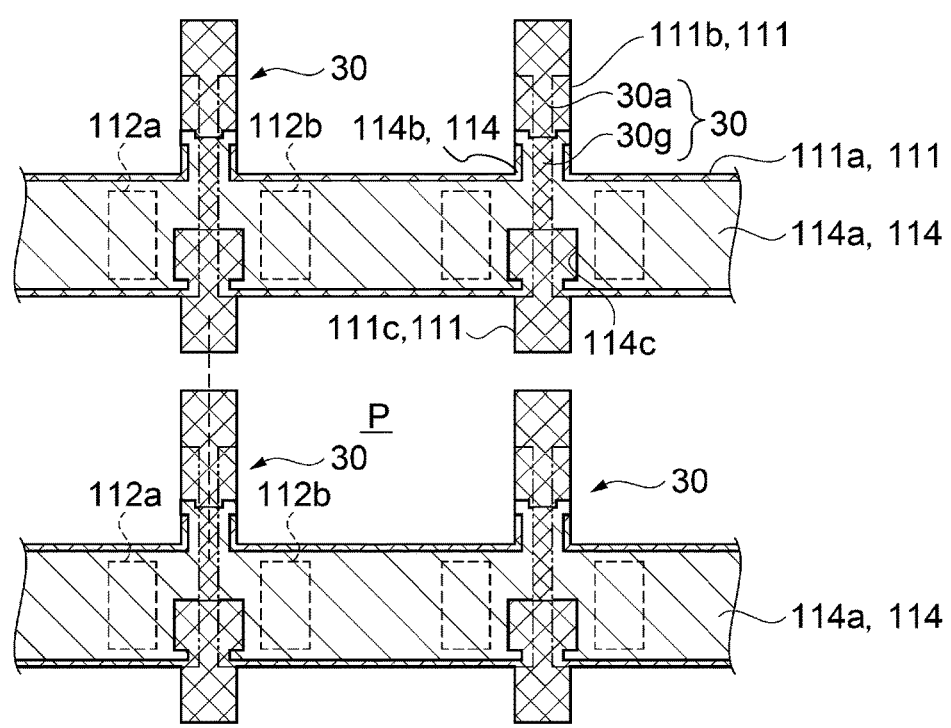
FIG. 7 is a schematic plan view illustrating a wiring line layout for scan lines.
Figure 8:
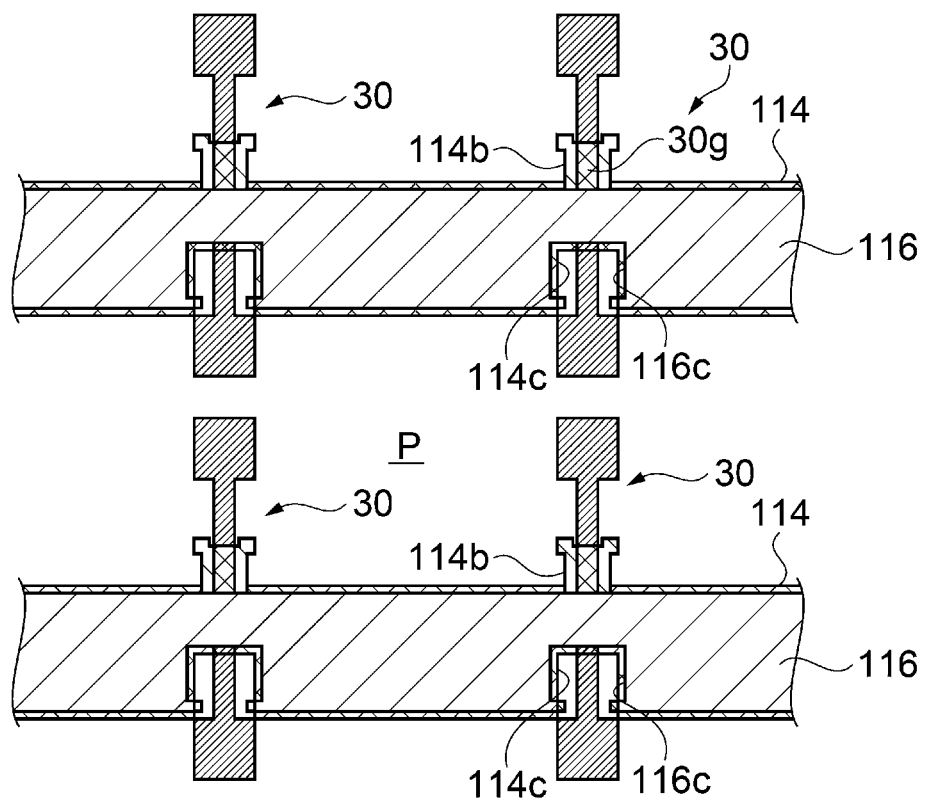
FIG. 8 is a schematic plan view illustrating a layout of a first shield layer.
Figure 9:
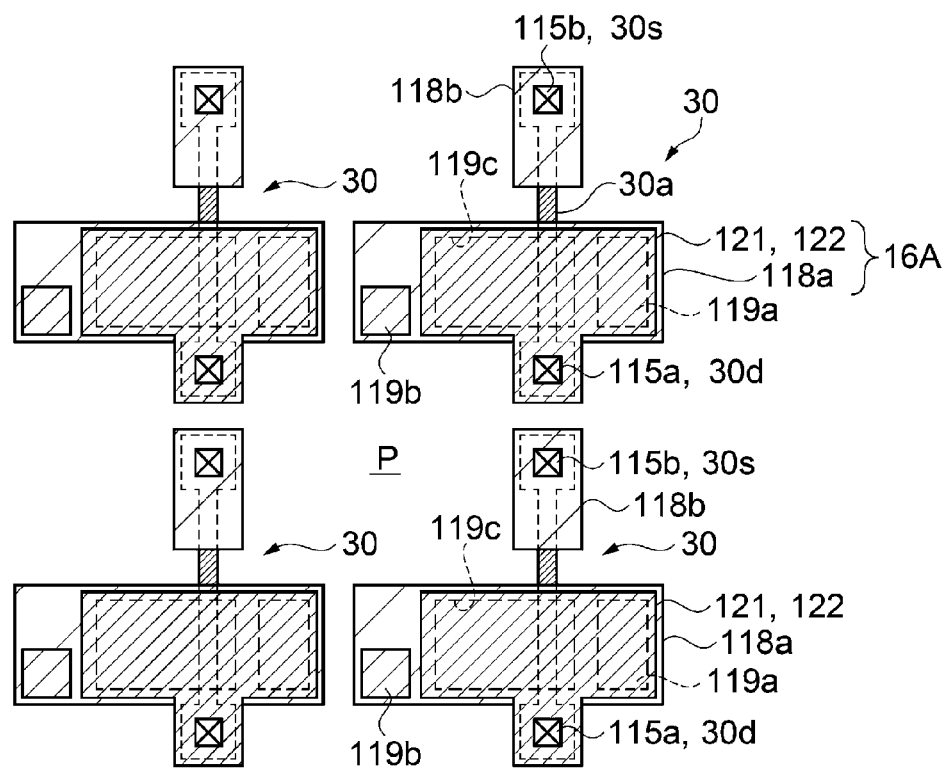
FIG. 9 is a schematic plan view illustrating a layout of a second shield layer and a first holding capacitor.
Figure 10:
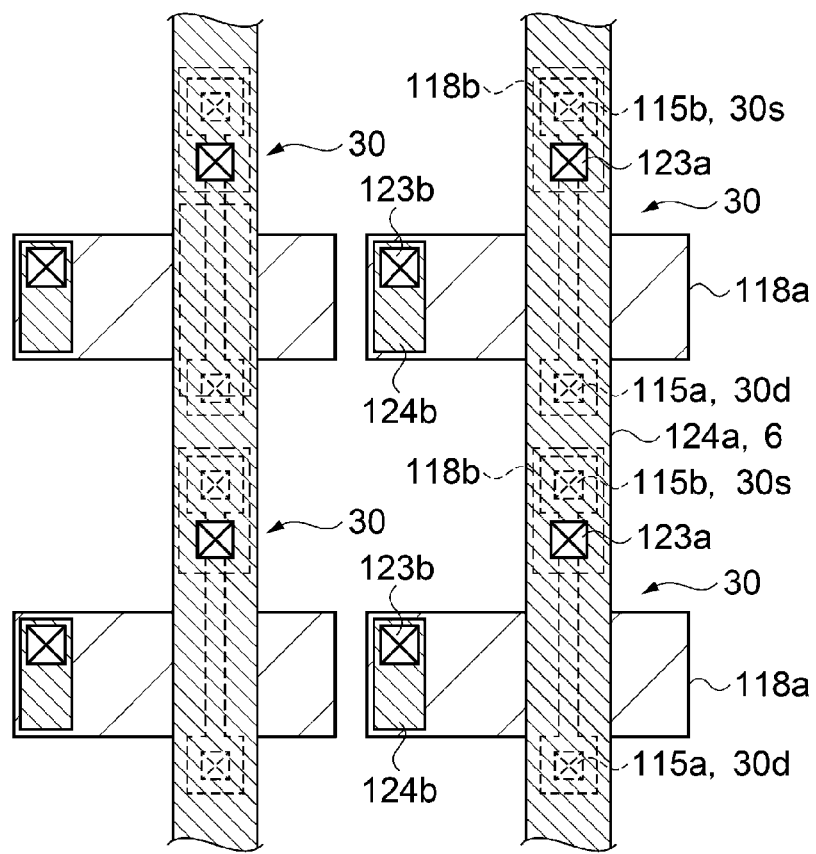
FIG. 10 is a schematic plan view illustrating a layout of data lines.
Figure 11:
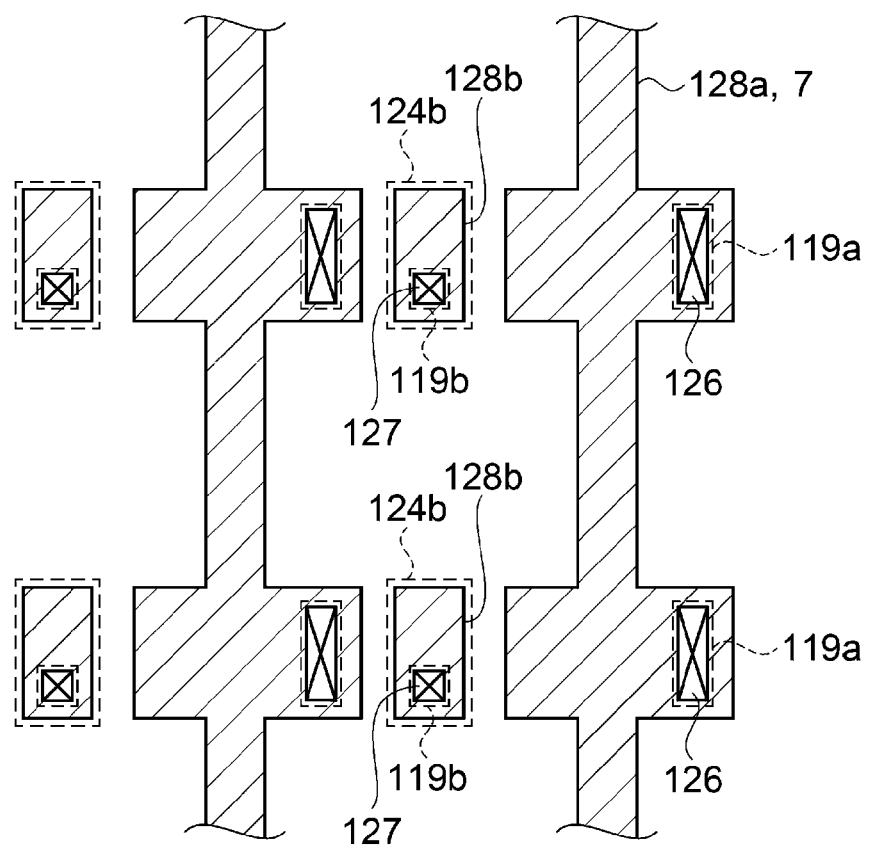
FIG. 11 is a schematic plan view illustrating a layout of fixed potential lines.
Figure 12:
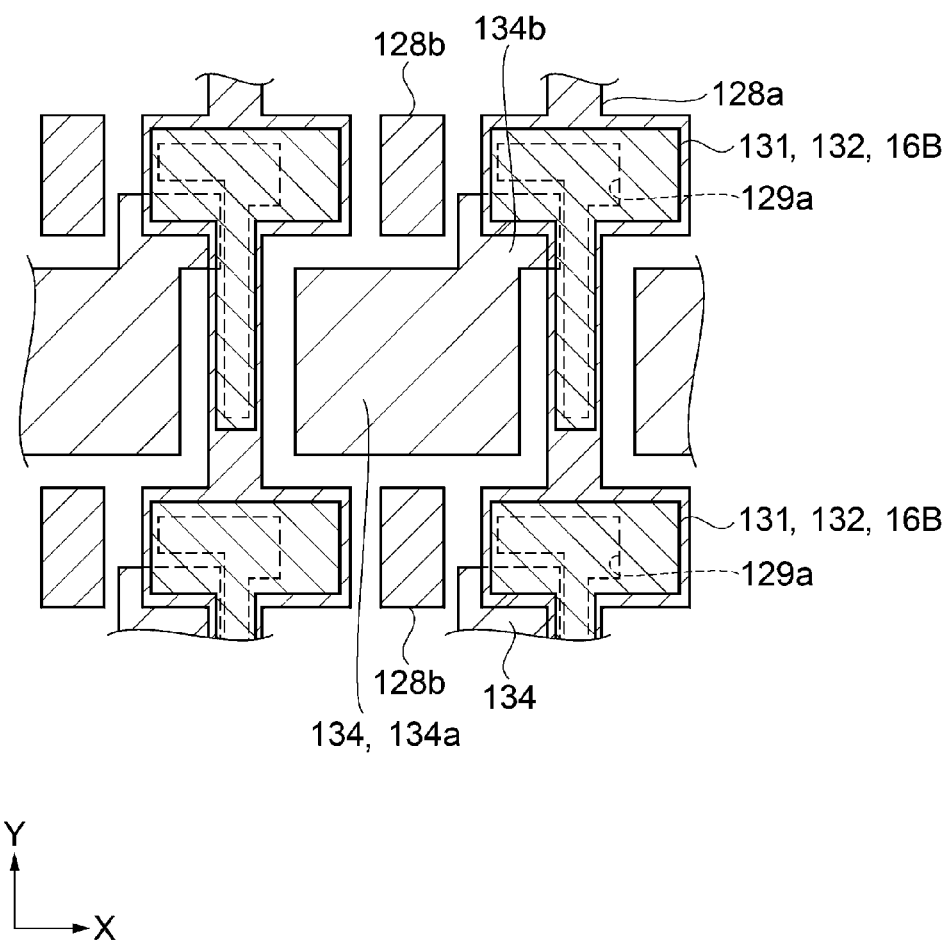
FIG. 12 is a schematic plan view illustrating a layout of a second holding capacitor.
Figure 13:
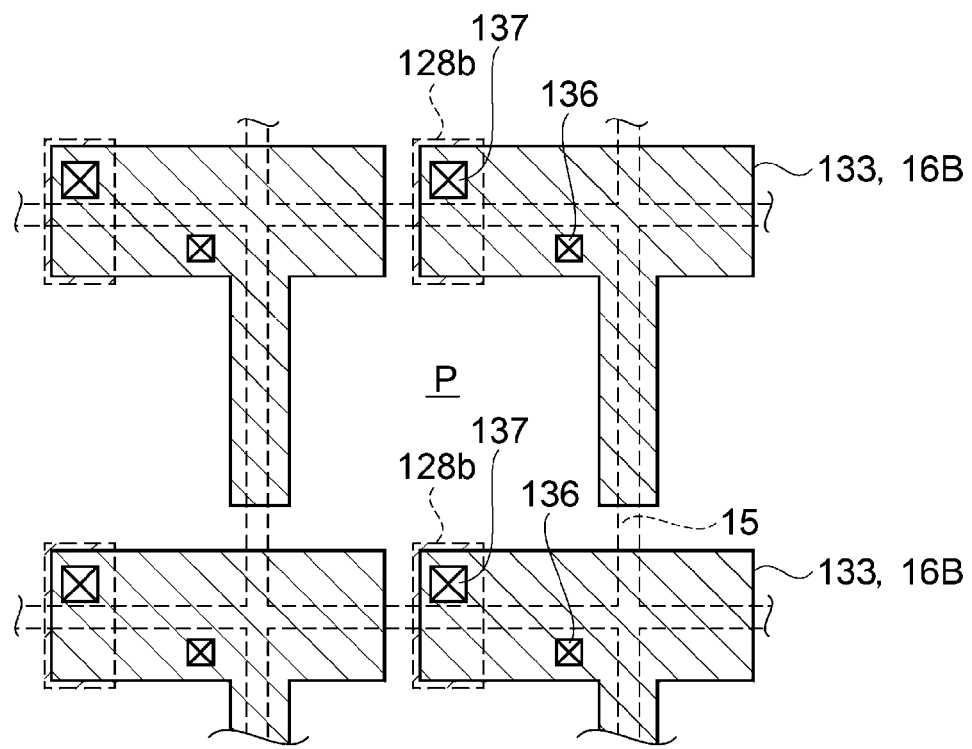
FIG. 13 is a schematic plan view illustrating a layout of second capacitor electrodes and pixel electrodes.

Next, explanation follows regarding the layout in plan view of wiring lines and the like in each of the wiring layers of the element substrate 10, with reference to FIG. 7 to FIG. 13. FIG. 7 is a schematic plan view illustrating a wiring line layout for scan lines. FIG. 8 is a schematic plan view illustrating a layout of a first shield layer. FIG. 9 is a schematic plan view illustrating a layout of a second shield layer and a first holding capacitor. FIG. 10 is a schematic plan view illustrating a layout of data lines. FIG. 11 is a schematic plan view illustrating a layout of fixed potential lines. FIG. 12 is a schematic plan view illustrating a layout of a second holding capacitor. FIG. 13 is a schematic perspective view illustrating a layout of a second capacitor electrode and pixel electrodes. Note that when each of the drawings is viewed face on, directions facing along the X direction are sometimes expressed as left side or right side, and directions facing along the Y direction are sometimes expressed as upper side or lower side.

As illustrated in FIG. 7, each of the light blocking portions 111 includes a main line 111a extending along the X direction, projections 111b projecting toward the upper side in the Y direction from the main line 111a at predetermined intervals along the X direction, and projections 111c projecting toward the lower side in the Y direction from the main line 111a at the same predetermined intervals along the X direction. The semiconductor layer 30a of the TFTs 30 is disposed so as to be superimposed on the two projections 111b, 111c that project out from the main line 111a in the Y direction.

By disposing two of the light blocking portions 111 above and below each other at predetermined intervals in the Y direction, a state is achieved in which the pixels P are substantially demarcated by the light blocking portions 111 in the X direction and the Y direction.

Each of the wiring lines 114 includes a main line 114a extending along the X direction and projections 114b extending toward the upper side in the Y direction from the main line 114a at predetermined intervals along the X direction so as to be superimposed on the main line 111a of the light blocking portions 111 in plan view. The width of the main line 111a and the width of the main line 114a in the Y direction are substantially the same as each other. The main line 114a of each of the wiring lines 114 is formed with cutouts 114c at portions on the opposite side in the Y direction to the projections 114b.

As described above, the wiring lines 114 are disposed on the base member 10s of the element substrate 10 above the semiconductor layer 30a of the TFTs 30, and the portions of the wiring line 114 superimposed on the semiconductor layer 30a in plan view function as the gate electrode 30g of the TFTs 30.

Substantially rectangular contact holes 112a and substantially rectangular contact holes 112b are provided on either side of the semiconductor layer 30a extending in the Y direction. The contact holes 112a are provided at the left side in the X direction of the semiconductor layer 30a at positions where the main line 111a of the light blocking portion 111 and the main line 114a of the wiring line 114 are superimposed on each other in plan view. Similarly, the contact holes 112b are provided at the right side in the X direction of the semiconductor layer 30a extending in the Y direction at positions where the main line 111a of the light blocking portion 111 and the main line 114a of the wiring line 114 are superimposed on each other in plan view. The light blocking portion 111 and the wiring line 114 are thereby electrically connected by the two contact holes 112a, 112b provided for each of the pixels P, and function as the scan line 3.

As illustrated in FIG. 8, the first shield layer 116 extends in the X direction so as to be superimposed on the main line 114a of the wiring line 114 in plan view. The width of the first shield layer 116 and the width of the main line 114a are substantially the same as each other in the Y direction. Cutouts 116c are also formed in the first shield layer 116 at the same positions where the cutouts 114c are formed in the main line 114a. Namely, a configuration is adopted in which the main line 114a of the wiring line 114 and the first shield layer 116 are reliably superimposed on each other in plan view. Note that the first shield layer 116 is not superimposed on the projections 114b of the wiring line 114. In other words, the first shield layer 116 is in a state of partial superimposition on the gate electrode 30g.

As illustrated in FIG. 9, the drain electrode 118a is disposed so as to straddle the semiconductor layer 30a of the TFTs 30 in the X direction, and is formed in a T shape so as to be superimposed on the first source/drain region 30d of the semiconductor layer 30a in plan view. The first source/drain region 30d and the drain electrode 118a are electrically connected together by the contact hole 115a provided at an end portion of the first source/drain region 30d.

Each of the openings 119c of the fourth layer intermediate insulation film 119 is superimposed on the drain electrode 118a in plan view, and is formed so as to straddle the semiconductor layer 30a. The projections 119a are each disposed on the right side of the opening 119c in the X direction, and the projections 119b are each disposed on the left side of the opening 119c in the X direction.

The first dielectric layer 121 and the second shield layer 122 configuring the first holding capacitor 16A are disposed, in plan view, so as to be superimposed on the projection 119a and the opening 119c and so as to also be superimposed on the first source/drain region 30d. The second shield layer 122 is not superimposed on the projection 119b in plan view. In the present embodiment the surface area of the opening 119c is, for example, approximately 3.75 µm², and the capacitance value of the first holding capacitor 16A configured by the drain electrode 118a, the first dielectric layer 121, and the second shield layer 122 at the opening 119c is approximately 15 fF (femtofarads).

The source electrode 118b formed in the same layer as the drain electrode 118a is disposed so as to be superimposed on the second source/drain region 30s of the semiconductor layer 30a in plan view. The second source/drain region 30s and the source electrode 118b are electrically connected together by the contact hole 115b provided at an end portion of the second source/drain region 30s.

Note that although the shapes of the projections 119a, 119b and the opening 119c in plan view are rectangular in FIG. 9, there is no limitation thereto. The projections 119a, 119b may, for example, have a circular shape or an elliptical shape.

As illustrated in FIG. 10, the wiring line 124a that functions as the data line 6 extends in the Y direction so as to be superimposed on the TFT 30 in plan view. The source electrode 118b and the wiring line 124a are electrically connected together by a contact hole 123a provided within the source electrode 118b. Due to the source electrode 118b being connected to the second source/drain region 30s by the contact hole 115b, the wiring line 124a that functions as the data line 6 is electrically connected to the second source/drain region 30s.

The relay layer 124b formed in the same layer as the wiring line 124a is disposed on the left side of the TFT 30 in the X direction, and is disposed so as to be superimposed on the drain electrode 118a in plan view. A contact hole 123b is provided in the relay layer 124b in order to electrically connect to the drain electrode 118a.

As illustrated in FIG. 11, the wiring line 128a that functions as the fixed potential line 7 extends in the Y direction and is superimposed in plan view on the wiring line 124a that functions as the data line 6. The wiring line 128a also includes projections that project out in the X direction so as to be superimposed in plan view on the projections 119a of the fourth layer intermediate insulation film 119. The wiring line 128a is electrically connected to the second shield layer 122 in a lower layer by the contact holes 126 provided at the positions where the wiring line 128a is superimposed in plan view on the projections 119a (see FIG. 5).

The relay layer 128b formed in the same layer as the wiring line 128a is provided on the left side of the wiring line 128a in the X direction, at a position superimposed in plan view on the projection 119b of the fourth layer intermediate insulation film 119. The relay layer 128b is electrically connected to the relay layer 124b in a lower layer by the contact hole 127 provided at a position where the relay layer 128b is superimposed in plan view on the projection 119b (see FIG. 5).

As illustrated in FIG. 12, the trench 129*a* of the seventh layer intermediate insulation film 129 is superimposed in plan view on the wiring line 128*a*, and is provided so as to have a portion that extends toward the left side in the X direction and a portion that extends toward the lower side in the Y direction. The projection 134 of the seventh layer intermediate insulation film 129 includes a main portion 134*a* provided in the opening region of the pixel P, and a jutting out portion 134*b* provided contiguously to the main portion 134*a* and superimposed on the wiring line 128*a*. The jutting out portion 134*b* is not superimposed on the trench 129*a* in plan view. The planarity of the pixel electrode 15 formed above the projection 134 is secured by the provision of the main portion 134*a* in the opening region.

The first capacitor electrode 131 and the second dielectric layer 132 configuring the second holding capacitor 16B are respectively provided so as to be superimposed in plan view on the wiring line 128*a*, and so as to be superimposed in plan view on the trench 129*a* and on part of the jutting out portion 134*b* of the projection 134. In the present embodiment, the effective surface area of the first capacitor electrode 131 contained in the trench 129*a* is, for example, 14.76 μm$^2$, and the capacitance value of the second holding capacitor 16B is, for example, 59 fF (femtofarads). The capacitance value of the second holding capacitor 16B is a value approximately three times the capacitance value of a case configured without the trench 129*a*.

As illustrated in FIG. 13, the second capacitor electrode 133 configuring the second holding capacitor 16B is disposed so as to be superimposed in plan view on the first capacitor electrode 131 and on the relay layer 128*b* that extends in the X direction in a lower layer, as illustrated in FIG. 12. A contact hole 137 is provided at a position superimposed on the relay layer 128*b* and the second capacitor electrode 133 is electrically connected to the relay layer 128*b* by the contact hole 137.

The pixel electrodes 15 are each disposed in an opening region of the pixel P such that outer edge portions of the pixel electrodes 15 are superimposed on the four second capacitor electrodes 133 disposed at predetermined intervals along the X direction and the Y direction. The contact holes 136 are each provided at positions superimposed on the jutting out portion 134*b* of the projection 134 illustrated in FIG. 12 in plan view. The pixel electrode 15 is electrically connected to the second capacitor electrode 133 by the contact hole 136.

Electrical Connection Between First Shield Layer and Routing Wires

Figure 14:
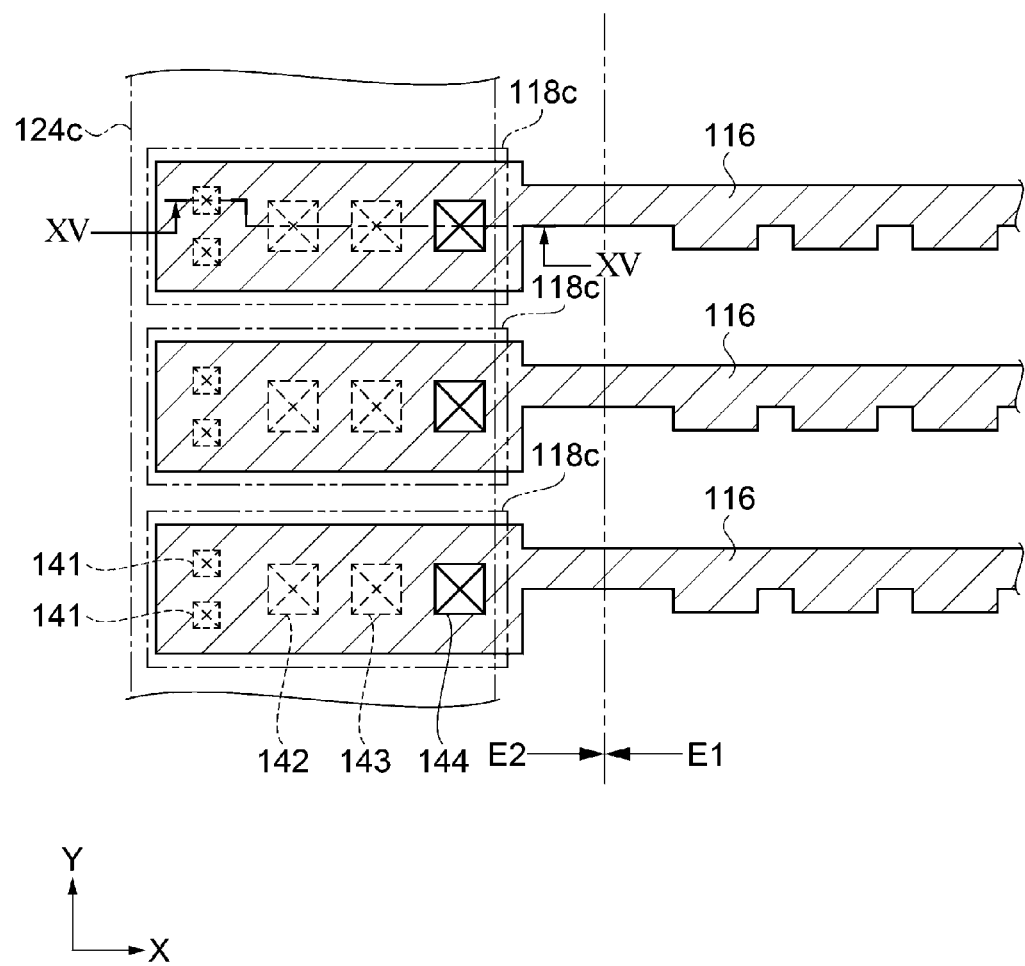
FIG. 14 is a schematic plan view illustrating a connection state between a first shield layer and routing wires.
Figure 15:
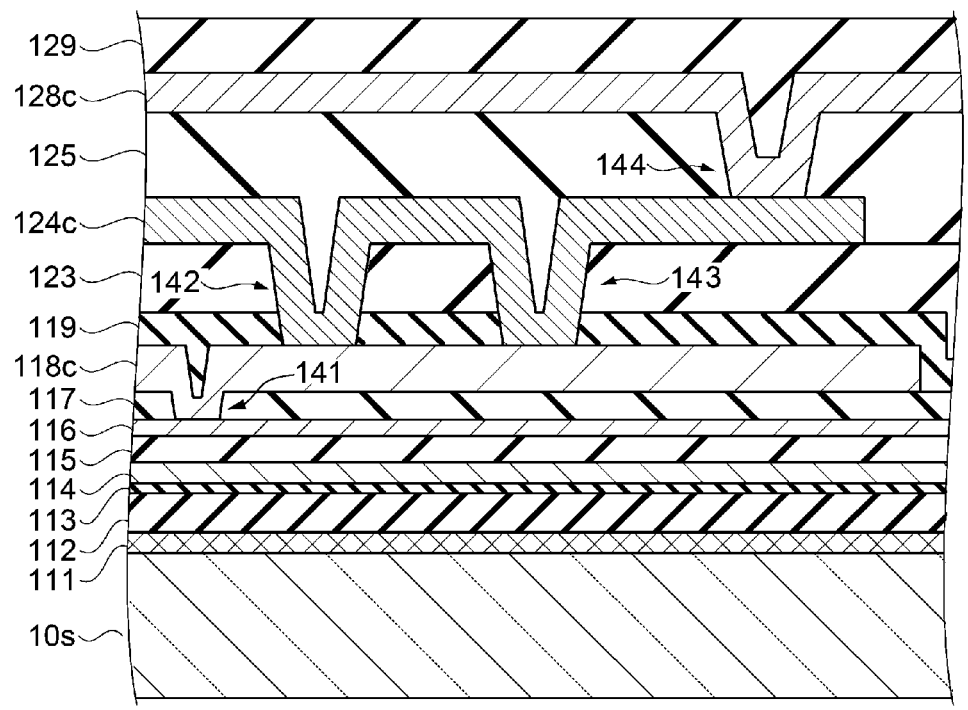
FIG. 15 is a schematic cross-section taken along line XV-XV of FIG. 14 and illustrating a connecting structure between a first shield layer and routing wires.
Figure 16:
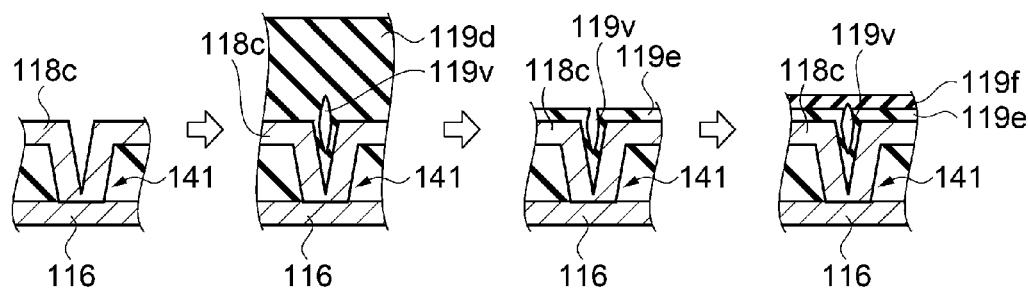
FIG. 16 is a schematic cross-section illustrating an example of a method of connecting a first shield layer and a relay layer.
Figure 17:
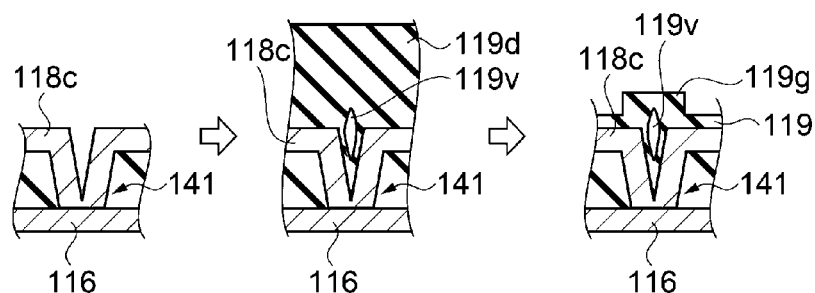
FIG. 17 is a schematic cross-section illustrating another example of a method of connecting a first shield layer and a relay layer.

Explanation follows regarding electrical connection between the first shield layer 116 and the routing wires that apply a fixed potential, with reference to FIG. 14 to FIG. 17. FIG. 14 is a schematic plan view illustrating a connection state between the first shield layer and routing wires. FIG. 15 is a schematic cross-section taken along line XV-XV of FIG. 14 and illustrating a connecting structure between the first shield layer and routing wires. FIG. 16 is a schematic cross-section illustrating an example of a method of connecting the first shield layer and the relay layer. FIG. 17 is a schematic cross-section illustrating another example of a method of connecting the first shield layer and the relay layer.

As illustrated in FIG. 14, the first shield layer 116 extending in the display region E1 along the X direction leads out from the display region E1 to a peripheral region E2. The width in the Y direction of the first shield layer 116 that has led out to the peripheral region E2 is wider that the width in the Y direction of the first shield layer 116 in the display region E1. In the peripheral region E2, relay layers 118*c* are provided so as to be superimposed in plan view on each of the plural first shield layers 116 arrayed at predetermined intervals in the Y direction, and a routing wire 124*c* is provided extending in the Y direction so as to straddle plural of the first shield layers 116.

Two contact holes 141 are provided at positions spaced apart in the Y direction to electrically connect the first shield layers 116 led out to the peripheral region E2 and the relay layer 118*c* together. Two contact holes 142, 143 are provided at positions spaced apart in the X direction to electrically connect the relay layer 118*c* and the routing wire 124*c* together. Moreover, a contact hole 144 is provided at the right side of the two contact holes 142, 143 in the X direction to electrically connect the routing wire 124*c* and upper layer wiring together.

The size in plan view of the two contact holes 141 for electrically connecting the first shield layers 116 and the relay layer 118*c* together is smaller than that of the other contact holes 142, 143, 144. For example, the other contact holes 142, 143, 144 are rectangular shaped (square shaped) with a side length of approximately 1 μm, and the contact holes 141 are rectangular shaped (square shaped) with a side length of approximately 0.6 μm. The plan view shape of the contact holes 141, 142, 143, 144 is not limited to being rectangular shaped (square shaped) and, for example, a circular shape may be employed therefor.

As illustrated in FIG. 15, the light blocking portion 111, the first intermediate insulation film 112, the gate insulation film 113, the wiring line 114, the second intermediate insulation film 115, and the first shield layers 116 are provided above the base member 10*s* of the element substrate 10 in this sequence. The above is the same as the wiring line structure in the pixels P previously described. A through hole is provided in the peripheral region E2 so as to pierce through the third layer intermediate insulation film 117 covering the first shield layer 116, and a conductive film is formed so as to cover the inside of the through hole. The conductive film is patterned to form the relay layer 118*c* and the contact holes 141. Note that as stated above the third layer intermediate insulation film 117 is, for example, made from a silicon oxide film having a film thickness of approximately 400 nm.

The fourth layer intermediate insulation film 119 and the fifth intermediate insulation film 123 are formed covering the relay layer 118*c*. Two through holes are formed at positions superimposed on the relay layer 118*c* so as to pierce through the fourth layer intermediate insulation film 119 and the fifth layer intermediate insulation film 123. A conductive film is formed so as to cover the inside of the two through holes. The conductive film is patterned so as to form the routing wire 124*c* and the two contact holes 142, 143. Note that as stated above the fourth layer intermediate insulation film 119 and the fifth layer intermediate insulation film 123 are, for example, configured by silicon oxide films, and the film thickness of the fourth layer intermediate insulation film 119 is approximately 200 nm, and the film thickness of the fifth layer intermediate insulation film 123 is approximately 600 nm.

The sixth layer intermediate insulation film 125 is formed covering the routing wire 124*c*, and a through hole is formed at a position superimposed on the routing wire 124*c* and piercing through the sixth layer intermediate insulation film 125. A conductive film is formed so as to cover the inside of the through hole, and the conductive film is patterned to form a wiring line 128*c* and the contact hole 144. Note that the wiring line 128*c* is formed in the same layer as the wiring line 128a that functions as the fixed potential line 7, and the wiring line 128a and the wiring line 128c are connected together. As stated above, the sixth layer intermediate insulation film 125 is, for example, configured by a silicon oxide film having a film thickness of approximately 900 nm. The seventh layer intermediate insulation film 129 is formed covering the wiring line 128c. Although layers above the seventh layer intermediate insulation film 129 are omitted from illustration in FIG. 15, they have the same structure as that of the element substrate 10 previously described.

In the present embodiment, the same potential as an LCCOM potential applied to the common electrode 23 is applied to the routing wire 124c. Namely, the LCCOM potential is applied as the fixed potential to the first shield layer 116 and to the wiring line 128a that functions as the fixed potential line 7.

As stated above, the depth of the contact holes 142, 143 piercing through the fourth layer intermediate insulation film 119 and the fifth layer intermediate insulation film 123, and the depth of the contact hole 144 piercing through the sixth layer intermediate insulation film 125, are shallower than the depth of the contact holes 141 piercing through the fourth layer intermediate insulation film 119. Hence, in order to stably form the contact holes 141, 142, 143, 144, when the aspect ratio between size in plan view and depth is considered, the size in plan view of the contact holes 142, 143, 144 needs to be bigger than that of the contact holes 141 that are shallower in depth.

The connection resistance at the contact holes 142, 143, 144 can be reduced by making the contact holes 142, 143, 144 larger in plan view. However, although the size in plan view of the contact holes 141 could be made smaller than that of the contact holes 142, 143, 144, the problem of an increase in connection resistance arises. Accordingly, one might consider, for example, making the size of the contact holes 141 the same size as the contact holes 142, 143, 144.

However, if the size of the contact holes 141 was, for example, to be the same size as the contact holes 142, 143, 144, then the following problem arises. As illustrated in FIG. 5, the projections 119a, 119b are provided in the fourth layer intermediate insulation film 119 covering the drain electrode 118a (the wiring lines 118). The fourth layer intermediate insulation film 119 and the projections 119a, 119b are, as stated above, configured by forming a film with a film thickness of 600 nm by, for example, etching and patterning a silicon oxide film. Thus, the fourth layer intermediate insulation film 119 covering the contact holes 141 in the peripheral region E2 is also formed by the same process.

As illustrated in FIG. 16, a silicon oxide film 119d is formed at a film thickness of, for example, 600 nm so as to cover the relay layer 118c and the contact holes 141, and there is a concern that a void 119v might arise at a portion covering the contact hole 141. When the silicon oxide film 119d is etched, and the film thickness of the remaining silicon oxide film 119e becomes, for example, 200 nm, then the void 119v opens up. If, for example, surface processing is performed using a stripper such as diluted HF (DHF) to remove residue and by-products from etching with the void 119v in an open state, then there is a concern that the silicon oxide film within the contact hole 141 would be etched by the stripper and the exposed conductive film also etched by the stripper. Namely, there is a concern as to whether the electrical connection between the first shield layer 116 and the relay layer 118c could be maintained.

Thus, in the present embodiment, as illustrated in FIG. 14, the size of the contact hole 141 is made smaller than that of the contact holes 142, 143, 144, thereby suppressing the void 119v from arising, and plural (two in the present embodiment) of the contact holes 141 are provided in order to ensure that the first shield layer 116 and the relay layer 118c are electrically connected. Moreover, as illustrated in FIG. 16, by again depositing a silicon oxide film 119f on the silicon oxide film 119e after etching, even supposing that the void 119v had occurred, then the void 119v would be closed by the silicon oxide film 119f.

The method to prevent such defects caused by the void 119v and the surface processing is not limited to the method of again depositing the silicon oxide film 119f as illustrated in FIG. 16. For example, as illustrated in FIG. 17, the silicon oxide film 119d may be selectively etched to form the fourth layer intermediate insulation film 119 having a projection 119g above the contact hole 141 such that the projections 119a, 119b are formed in the pixel P as illustrated in FIG. 5. Opening of the void 119v can be prevented by the projection 119g.

Note that there is also a concern that such defects caused by the void 119v and the surface processing might arise at the contact hole 115a for the drain electrode 118a and at the contact hole 115b for the source electrode 118b formed in the same layer as the relay layer 118c. The contact holes 115a, 115b are provided in the non-opening regions, and the size in plan view of the contact holes 115a, 115b is therefore necessarily limited from the perspective of securing the opening coverage ratio of the pixels P. The plan view shape of the contact holes 115a, 115b in the present embodiment is a rectangular shape (square shape) having a side of 0.6 μm or less. Namely, the void 119v is not liable to occur at the contact holes 115a, 115b. In the present embodiment the size of the contact holes 115a, 115b in the pixels P and the size of the contact hole 141 for the relay layer 118c in the peripheral region E2 are made substantially the same as each other, thereby preventing the void 119v from occurring.

The following advantageous effects are exhibited by the liquid crystal device 100 of the above embodiment.

(1) Due to the first shield layer 116 applied with the fixed potential being disposed above the base member 10s of the element substrate 10 between the gate electrode 30g (the wiring line 114) and the drain electrode 118a, the occurrence of push down in which the potential of the drain electrode 118a fluctuates due to switching the potential of the gate electrode 30g can be prevented. For example, the advantageous effects are particularly useful in enabling the occurrence of push down to be reliably prevented when the number of pixels P disposed in the display region E1 of the liquid crystal device 100 is increased so as to be compatible with full high definition, 4K, or the like, due to an increase in speed with which the scan signals SC1, SC2, . . . , to SCm are applied to the gate electrode 30g within a given scanning period.

Moreover, disposing the second shield layer 122 that is applied with the same fixed potential between the drain electrode 118a and the data line 6 (the wiring line 124a) serving as the signal line enables the prevention of crosstalk that arises due to fluctuations in the potential of the drain electrode 118a caused by a potential related the image signal applied to the data line 6 (the wiring line 124a).

Moreover, the opening 119c is provided in the fourth layer intermediate insulation film 119 covering the drain electrode 118a, and the first holding capacitor 16A is configured in the opening 119c by part of the drain electrode 118a and by the first dielectric layer 121 and the second shield layer 122. In addition, electrical connection is made to the wiring line 128a that functions as the fixed potential line 7 by using the part of the second shield layer 122 that is superimposed on the insulating projection 119a disposed between the drain electrode 118a and the first dielectric layer 121. Hence, in comparison to cases in which connection is made between the part of the second shield layer 122 that is not superimposed on the projection 119a and the wiring line 128a using, for example, a contact hole, the depth of the contact hole 126 for the connection can be made shallower. Making the depth of the contact hole 126 shallower enables the size of the contact hole 126 in plan view of the element substrate 10 to be decreased due to the relationship to the aspect ratio of the contact hole 126. Since the contact hole 126 needs to be formed in the non-opening region that does not affect display, the ability to reduce the size of the contact hole 126 enables the contact hole 126 to be easily provided even when the non-opening region is narrow. This enables a desired opening coverage ratio to be secured in the pixels P even when the two shield layers 116, 122 and the first holding capacitor 16A are provided on the element substrate 10 in this manner.

Namely, a liquid crystal device 100 can be provided as an electro-optical device that is capable of realizing excellent display quality by preventing fluctuations in the potential of the drain electrode 118a due to the two shield layers 116, 122, and by also securing the first holding capacitor 16A. In addition, the liquid crystal device 100 can be provided that is capable of bright display and avoids a complicated wiring line structure in the element substrate 10 even though plural wiring layers are provided containing the two shield layers 116, 122 and the first holding capacitor 16A.

(2) The first shield layer 116 extends along the X direction as a first direction so as to be superimposed on the wiring line 114 in plan view of the element substrate 10. This enables push down of the potential of the drain electrode 118a to be reliably prevented due to the first shield layer 116 extending in the X direction superimposed on the wiring line 114 that functions as the gate electrode 30g.

(3) The wiring line 124a that functions as the data line 6 extends in the Y direction as a second direction intersecting with the X direction, and the wiring line 128a that functions as the fixed potential line 7 extends in the Y direction so as to be superimposed on the wiring line 124a in plan view of the element substrate 10. This means that the fixed potential line 7 (the wiring line 128a) is present between the data line 6 (the wiring line 124a) and the pixel electrode 15, thereby enabling fluctuations to be prevented in the potential of the pixel electrode 15 caused by the potential of the data line 6 (the wiring line 124a).

(4) The trench 129a is formed in the seventh layer intermediate insulation film 129 between the fixed potential line 7 (the wiring line 128a) and the pixel electrode 15. The second holding capacitor 16B is superimposed in plan view on the wiring line 128a, and is configured by: the first capacitor electrode 131 that is superimposed on at least the trench 129a; the second dielectric layer 132 contacting the first capacitor electrode 131; and the second capacitor electrode 133 contacting the second dielectric layer 132. The first capacitor electrode 131 and the fixed potential line 7 (the wiring line 128a) are connected together at a bottom portion of the trench 129a, and the pixel electrode 15 is connected to the drain electrode 118a through the second capacitor electrode 133. This enables electrical capacitance of the holding capacitors 16 to be secured due to providing the second holding capacitor 16B in addition to the first holding capacitor 16A, and enables fluctuations in the potential of the pixel electrode 15 to be suppressed. Moreover, the second holding capacitor 16B is provided so as to be superimposed on the trench 129a provided in the seventh layer intermediate insulation film 129 between the fixed potential line 7 (the wiring line 128a) and the pixel electrode 15, and so as to be superimposed on part of the jutting out portion 134b of the projection 134. This makes it easier to secure the desired electrical capacitance even with narrow non-opening regions than in cases in which the first capacitor electrode 131 is a flat plate shape.

(5) The opposing substrate 20 includes the common electrode 23 disposed facing the plural pixel electrodes 15 of the element substrate 10 across the liquid crystal layer 50. The same potential as the LCCOM potential applied to the common electrode 23 is applied to the first shield layer 116 and the second shield layer 122. Thus, the electrical circuit configuration can be simplified due to being able to employ the fixed potential also as the potential of the common electrode 23.

(6) In the peripheral region E2, when electrically connecting the first shield layer 116 to the routing wire 124c applied with the fixed potential, the size of the contact holes 141 provided in the third layer intermediate insulation film 117 between the relay layer 118c and the first shield layer 116 is smaller than the size of the other contact holes 142, 143, 144 provided in the peripheral region E2. Specifically, the contact holes 141 are rectangular shaped (square shaped) with a side of 0.6 µm or less. The relay layer 118c inside the contact hole 141 is thus not liable to be etched by etching processing and stripping for forming the fourth layer intermediate insulation film 119 covering the relay layer 118c, enabling connection defects to be prevented from arising.

(7) The contact hole 136 for electrically connecting the pixel electrodes 15 and the second capacitor electrode 133 together is disposed above the projection 134 provided in the seventh layer intermediate insulation film 129. This enables the depth of the contact hole 136 to be shallower than in cases in which the contact hole 136 is provided in plan view at a portion other than at the projection 134. Namely, the size of the contact hole 136 can be decreased in consideration of the aspect ratio between the size and the depth of the contact hole 136. Namely, due to being able to make indentations and protrusions on the pixel electrodes 15 caused by the contact hole 136 smaller, disorder can be reduced in the orientation in the liquid crystal layer 50 held between the pixel electrodes 15 and the common electrode 23.

Second Embodiment

Electrical Apparatus

Figure 18:
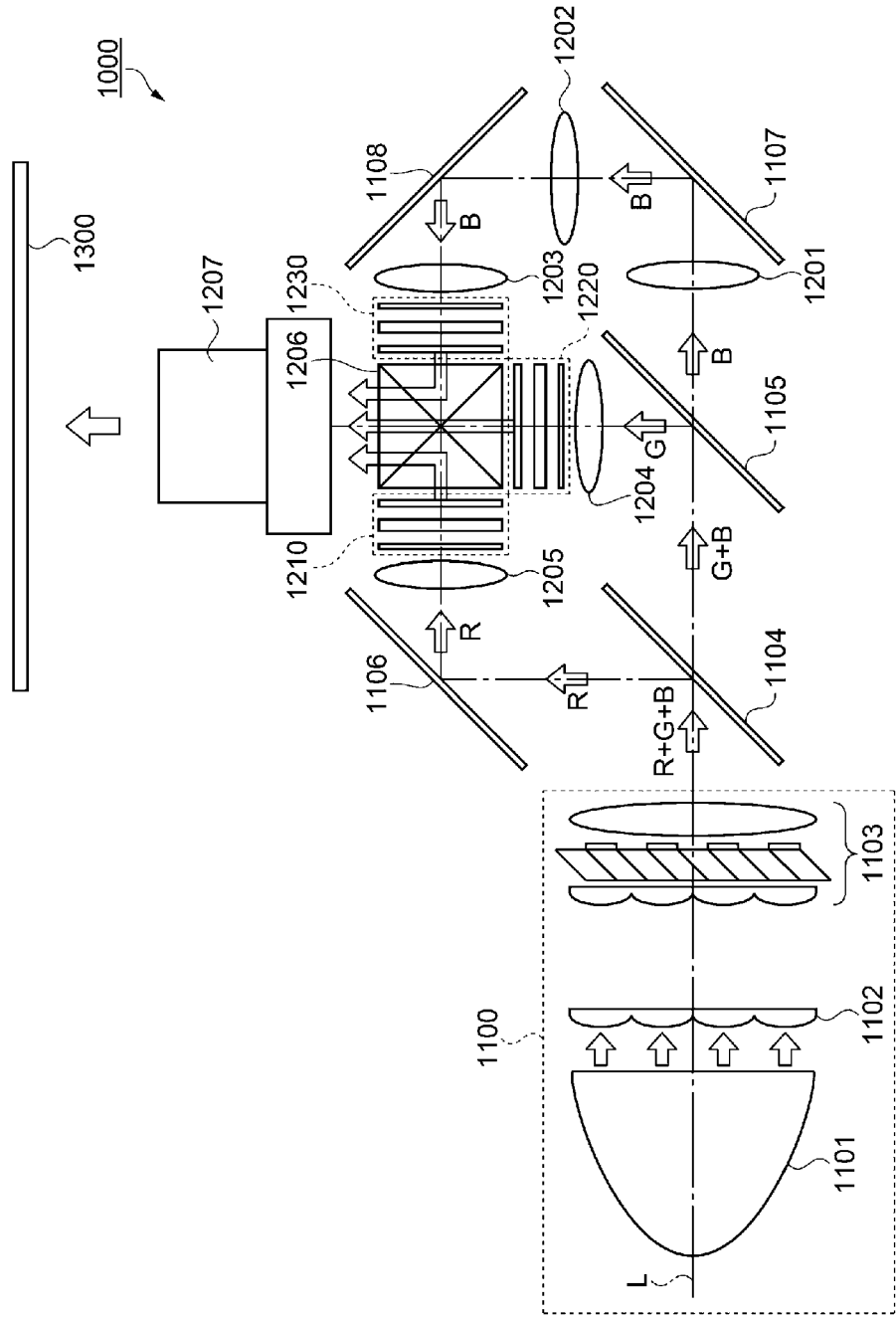
FIG. 18 is a schematic diagram illustrating a configuration of a projection-type display device serving as an electrical apparatus of a second embodiment.

Explanation follows regarding a projection type of display device serving as an electrical apparatus to which the liquid crystal device 100 is applied as an electro-optical device of the present embodiment, with reference to FIG. 18. FIG. 18 is a schematic diagram illustrating a configuration of a projection type of display device.

As illustrated in FIG. 18, a projection-type display device 1000 serving as an electrical apparatus of the present embodiment includes a polarized light illumination device 1100 disposed along a system optical axis L, and two dichroic mirrors 1104, 1105 serving as light splitting elements. The projection-type display device 1000 also includes three reflection mirrors 1106, 1107, 1108, and five relay lenses 1201, 1202, 1203, 1204, 1205. The projection-type display device 1000 also includes three transmission-type liquid crystal light bulbs 1210, 1220, 1230 serving as optical modulation units, a cross dichroic prism 1206 serving as an light combining element, and a projection lens 1207.

The polarized light illumination device 1100 is substantially configured from: a lamp unit 1101, serving as a light source configured from a white light source such as an ultra-high voltage mercury lamp or a halogen lamp; an integrator lens 1102; and a polarized light conversion element 1103.

From out of a polarized light beam radiated from the polarized light illumination device 1100, the dichroic mirror 1104 reflects red light (R), but transmits green light (G) and blue light (B). The other dichroic mirror 1105 reflects the green light (G) transmitted by the dichroic mirror 1104 and transmits the blue light (B).

After the red light (R) reflected by the dichroic mirror 1104 has been reflected by the reflection mirror 1106, the red light (R) is then incident to the liquid crystal light bulb 1210 through the relay lens 1205.

The green light (G) reflected by the dichroic mirror 1105 is incident to the liquid crystal light bulb 1220 via the relay lens 1204.

The blue light (B) transmitted by the dichroic mirror 1105 is incident to the liquid crystal light bulb 1230 via a guide optical system configured by the three relay lenses 1201, 1202, 1203 and the two reflection mirrors 1107, 1108.

The liquid crystal light bulbs 1210, 1220, 1230 are each disposed so as to face toward the incident face of the cross dichroic prism 1206 for each respective color. The colored light incident to the liquid crystal light bulbs 1210, 1220, 1230 is modulated according to picture information (a picture signal) and emitted toward the cross dichroic prism 1206. The cross dichroic prism 1206 is formed by adhering four right angled prisms together so as to form a cross shape composed of a dielectric multilayer film that reflects red light at the internal faces thereof, and a dielectric multilayer film that reflects blue light at the internal faces thereof. The light of three colors is combined by these dielectric multilayer films, thereby combining light to display a color image. The combined light is projected onto a screen 1300 by the projection lens 1207 configuring a projecting optical system, such that the image is enlarged and displayed.

The liquid crystal light bulb 1210 is a liquid crystal light bulb applied with the liquid crystal device 100 of the first embodiment (see FIG. 1). A pair of polarizers, configured by cross Nicol prisms disposed on incident side and the emitting side of the colored light of the liquid crystal device 100, are disposed with a gap therebetween. The other liquid crystal light bulbs 1220, 1230 have a similar configuration.

According to such a projection-type display device 1000, the liquid crystal device 100 of the first embodiment is employed as the liquid crystal light bulbs 1210, 1220, 1230, and so push down of the drain electrode 118a in the TFTs 30, crosstalk between the pixels P, and the like are reduced, enabling the provision of the projection-type display device 1000 that obtains a display state having a good appearance.

The invention is not limited to the above embodiments, and appropriate changes are possible within a range not conflicting with the gist or spirit of the invention as taken from the scope of the claims and the specification as a whole. Electro-optical devices incorporating such changes, and electrical apparatuses applied with such electro-optical devices, fall within the scope of technology of the invention. Various modified examples are conceivable apart from the above embodiments. Some modified examples are given below.

Modified Example 1

The configuration of the element substrate 10 and the opposing substrate 20 is not limited to the above. In cases in which the liquid crystal device 100 is employed as a liquid crystal light bulb, configuration may be adopted that includes optical elements such as microlenses and prisms provided on at least one out of the element substrate 10 or the opposing substrate 20 to efficiently utilize light incident to the pixels P.

Modified Example 2

Configuring the first holding capacitor 16A by utilizing configuration on the element substrate 10 of the first shield layer 116 provided between the drain electrode 118a and the gate electrode 30g and the second shield layer 122 provided between the drain electrode 118a and the data line 6 (the wiring line 124a) and utilizing the second shield layer 122 is not limited to application to the liquid crystal device 100. For example, application may also be made to an electro-optical device provided with organic electroluminescent (EL) elements serving as light emitting elements in the pixels P.

Modified Example 3

The electrical apparatus applied with the liquid crystal device 100 of the first embodiment is not limited to the projection-type display device 1000 of the second embodiment. For example, a single substrate configuration of projection-type display device 1000 may be adopted in which color filters corresponding to at least red (R), green (G), and blue (B) are provided on the opposing substrate 20 of the liquid crystal device 100. Moreover, for example, the liquid crystal device 100 is suitably applied as a display section for a projection type of head-up display (HUD), a head-mounted display (HMD), an electronic book, a personal computer, a digital still camera, a liquid crystal television, either a viewfinder type or a direct-view monitor type of video recorder, a car navigation system, an electronic diary, or a data terminal such as a POS terminal.

The entire disclosure of Japanese Patent Application No. 2016-175292, filed Sep. 8, 2016 is expressly incorporated by reference herein in its entirety.

What is claimed is:
1. An electro-optical device comprising:
   an element substrate including a pixel electrode and a thin film transistor for each of a plurality of pixels, a scan line, and a signal line; and
   on the element substrate,
      a drain electrode disposed between a gate electrode of the thin film transistor and the signal line,
      a first shield layer disposed between the gate electrode and the drain electrode and configured to be applied with a fixed potential,
      a first dielectric layer disposed between the drain electrode and the signal line and provided contacting part of the drain electrode,
      a second shield layer contacting the first dielectric layer, and
      a fixed potential line disposed between the second shield layer and the pixel electrode and configured to be applied with the fixed potential,
         the second shield layer being connected to the fixed potential line, and
         the drain electrode, the first dielectric layer, and the second shield layer configuring a first holding capacitor.

2. An electro-optical device comprising:
an element substrate including a pixel electrode and a thin film transistor for each of a plurality of pixels, a scan line, and a signal line; and
on the element substrate,
a drain electrode disposed between a gate electrode of the thin film transistor and the signal line,
a first shield layer disposed between the gate electrode and the drain electrode and configured to be applied with a fixed potential,
a first dielectric layer disposed between the drain electrode and the signal line and provided contacting part of the drain electrode,
a projection having insulating properties and disposed between the drain electrode and the first dielectric layer,
a second shield layer contacting the first dielectric layer, and
a fixed potential line disposed between the second shield layer and the pixel electrode and configured to be applied with the fixed potential,
the second shield layer being connected to the fixed potential line at a portion of the fixed potential line superimposed on the projection in plan view of the element substrate; and
the drain electrode, the first dielectric layer, and the second shield layer configuring a first holding capacitor.

3. The electro-optical device according to claim 1, wherein:
the scan line extends along a first direction, and part of the scan line acts as the gate electrode; and
the first shield layer extends in the first direction superimposed on the scan line in plan view of the element substrate.

4. The electro-optical device according to claim 2, wherein:
the scan line extends along a first direction, and part of the scan line acts as the gate electrode; and
the first shield layer extends in the first direction superimposed on the scan line in plan view of the element substrate.

5. The electro-optical device according to claim 3, wherein:
the signal line extends in a second direction intersecting the first direction; and
the fixed potential line extends in the second direction superimposed on the signal line in plan view of the element substrate.

6. The electro-optical device according to claim 4, wherein:
the signal line extends in a second direction intersecting the first direction; and
the fixed potential line extends in the second direction superimposed on the signal line in plan view of the element substrate.

7. The electro-optical device according to claim 1, wherein:
the electro-optical device further comprises
a trench provided in an intermediate insulation film between the fixed potential line and the pixel electrode; and
a second holding capacitor configured by
a first capacitor electrode covering at least the trench,
a second dielectric layer contacting the first capacitor electrode, and
a second capacitor electrode contacting the second dielectric layer; and
the first capacitor electrode and the fixed potential line are connected together at a portion at the bottom of the trench;
the pixel electrode is connected to the drain electrode through the second capacitor electrode.

8. The electro-optical device according to claim 2, wherein:
the electro-optical device further comprises
a trench provided in an intermediate insulation film between the fixed potential line and the pixel electrode; and
a second holding capacitor configured by
a first capacitor electrode covering at least the trench,
a second dielectric layer contacting the first capacitor electrode, and
a second capacitor electrode contacting the second dielectric layer; and
the first capacitor electrode and the fixed potential line are connected together at a portion at the bottom of the trench;
the pixel electrode is connected to the drain electrode through the second capacitor electrode.

9. The electro-optical device according to claim 1, wherein:
the electro-optical device further comprises an opposing substrate including a common electrode that is disposed facing across a liquid crystal layer toward the plurality of pixel electrodes of the element substrate; and
a potential applied to the common electrode and the fixed potential are the same potential as each other.

10. The electro-optical device according to claim 2, wherein:
the electro-optical device further comprises an opposing substrate including a common electrode that is disposed facing across a liquid crystal layer toward the plurality of pixel electrodes of the element substrate; and
a potential applied to the common electrode and the fixed potential are the same potential as each other.

11. An electrical apparatus comprising the electro-optical device according to claim 1.

12. An electrical apparatus comprising the electro-optical device according to claim 2.

13. An electrical apparatus comprising the electro-optical device according to claim 3.

14. An electrical apparatus comprising the electro-optical device according to claim 4.

15. An electrical apparatus comprising the electro-optical device according to claim 5.

16. An electrical apparatus comprising the electro-optical device according to claim 6.

17. An electrical apparatus comprising the electro-optical device according to claim 7.

18. An electrical apparatus comprising the electro-optical device according to claim 8.

19. An electrical apparatus comprising the electro-optical device according to claim 9.

20. An electrical apparatus comprising the electro-optical device according to claim 10.

* * * * *